(12) United States Patent
Chen et al.

(10) Patent No.: US 12,707,627 B2
(45) Date of Patent: Aug. 11, 2026

(54) MEMORY DEVICE AND MANUFACTURING METHOD THEREOF

(71) Applicant: Yangtze Memory Technologies Co., Ltd., Wuhan (CN)

(72) Inventors: He Chen, Wuhan (CN); Ziqun Hua, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 641 days.

(21) Appl. No.: 18/082,202

(22) Filed: Dec. 15, 2022

(65) Prior Publication Data

US 2024/0188275 A1 Jun. 6, 2024

(30) Foreign Application Priority Data

Dec. 6, 2022 (CN) ......................... 202211557957.7

(51) Int. Cl.
*H10B 12/00* (2023.01)

(52) U.S. Cl.
CPC ............. *H10B 12/05* (2023.02); *H10B 12/30* (2023.02); *H10B 12/482* (2023.02)

(58) Field of Classification Search
CPC ....... H10B 12/30; H10B 12/05; H10B 12/482
See application file for complete search history.

(56) References Cited

U.S. PATENT DOCUMENTS 11,239,117 B1 * 2/2022 Saeedi Vahdat ....... H10B 12/05
2015/0061134 A1 * 3/2015 Lee ........................ H10B 12/34
257/751

* cited by examiner

*Primary Examiner* — Steven M Page
(74) *Attorney, Agent, or Firm* — Anova Law Group, PLLC

(57) ABSTRACT

A method of forming a memory device including providing a base wafer including a semiconductor material layer, and forming first and second spacers in the semiconductor material layer. The first spacers extend from a first surface of the semiconductor material layer to a second surface of the semiconductor material layer. The second spacers cross the first spacers and extend from the first surface of the semiconductor material layer to a position inside the semiconductor material layer. A plurality of semiconductor material strips are formed each between bottoms of the second spacers and the second surface of the semiconductor material layer and sandwiched between two neighboring first spacers. The method further includes performing a silicidation process at the second surface of the semiconductor material layer to convert at least portion of each of the semiconductor material strips into a silicide layer.

20 Claims, 30 Drawing Sheets

1200

Memory Device

1202

Memory Controller

1204

1206

MEMORY DEVICE AND MANUFACTURING METHOD THEREOF

CROSS-REFERENCE TO RELATED APPLICATION

This application claims the priority of Chinese Patent Application No. 202211557957.7, filed on Dec. 6, 2022, the content of which is incorporated herein by reference in its entirety.

FIELD OF THE TECHNOLOGY

This application relates to the field of memory devices and, more particularly, to a dynamic random-access memory device and manufacturing method thereof.

BACKGROUND OF THE DISCLOSURE

Memory devices, such as dynamic random-access memory (DRAM) devices, are widely used in smartphones, tablets, laptops, desktop computers, data servers, or other computational devices. New memory device structures have been developed to overcome the inherent scaling limitations and to improve the cost effectiveness of mass production. One of these structures is a memory device with a vertical-channel transistor structure. Such a memory device has the advantage of significantly reducing the chip area compared with a conventional memory device.

Wafer bonding is a technology widely used in the process of forming a memory device such as a vertical-channel memory device. In the wafer bonding process of a vertical-channel memory device, sources and drains are led out on a front surface and a bonding back surface of the device, respectively. For example, sources are led out using a metal layer and a single contact. The drains are led out using a backside process, and bit lines are formed at the backside to connect to the drains. Because of the wafer bonding process, photolithography alignment in a backside process is difficult. As the technology continuously develops, the critical size of the devices becomes smaller and smaller, and the size of the alignment window for the photolithography process also becomes smaller, making the alignment during photolithography even more difficult. As a result, the yield of the products is reduced. Further, the wafer bonding process and the strain of previous layers induce local distortion of the device pattern. For example, some drains that are supposed to be on a straight line can deviate from that line, and hence some of the drains become not aligned with the bit lines, causing broken circuit or increasing contact resistance. This could further reduce the yield of the products and induce resistance-capacitor (RC) delay, influencing the uniformity of performance of the device.

SUMMARY

In accordance with the disclosure, there is provided a method of forming a memory device including providing a base wafer that includes a semiconductor material layer, forming a plurality of first spacers in the semiconductor material layer, and forming a plurality of second spacers in the semiconductor material layer. The plurality of first spacers extend from a first surface of the semiconductor material layer to a second surface of the semiconductor material layer. The plurality of second spacers cross the plurality of first spacers and extend from the first surface of the semiconductor material layer to a position inside the semiconductor material layer. A plurality of semiconductor material strips are formed each between bottoms of the second spacers and the second surface of the semiconductor material layer and sandwiched between two neighboring ones of the first spacers. The method further includes performing a silicidation process at the second surface of the semiconductor material layer to convert at least portion of each of the semiconductor material strips into a silicide layer.

Also in accordance with the disclosure, there is provided a memory device including a semiconductor material layer, a plurality of first spacers in the semiconductor material layer, a plurality of second spacers in the semiconductor material layer, and a plurality of silicide layers. The plurality of first spacers extend from a first surface of the semiconductor material layer to a second surface of the semiconductor material layer. The plurality of second spacers cross the plurality of first spacers and extend from the first surface of the semiconductor material layer to a position inside the semiconductor material layer. The plurality of silicide layers extend from the second surface of the semiconductor material layer into the semiconductor material layer. Each of the plurality of silicide layers has a strip shape and is sandwiched between two neighboring ones of the plurality of spacers.

Also in accordance with the disclosure, there is provided a memory system including a memory device and a memory controller coupled to the memory device and configured to control operation of the memory device. The memory device includes a semiconductor material layer, a plurality of first spacers in the semiconductor material layer, a plurality of second spacers in the semiconductor material layer, and a plurality of silicide layers. The plurality of first spacers extend from a first surface of the semiconductor material layer to a second surface of the semiconductor material layer. The plurality of second spacers cross the plurality of first spacers and extend from the first surface of the semiconductor material layer to a position inside the semiconductor material layer. The plurality of silicide layers extend from the second surface of the semiconductor material layer into the semiconductor material layer. Each of the plurality of silicide layers has a strip shape and is sandwiched between two neighboring ones of the plurality of spacers.

DESCRIPTION OF EMBODIMENTS

Figure 1:
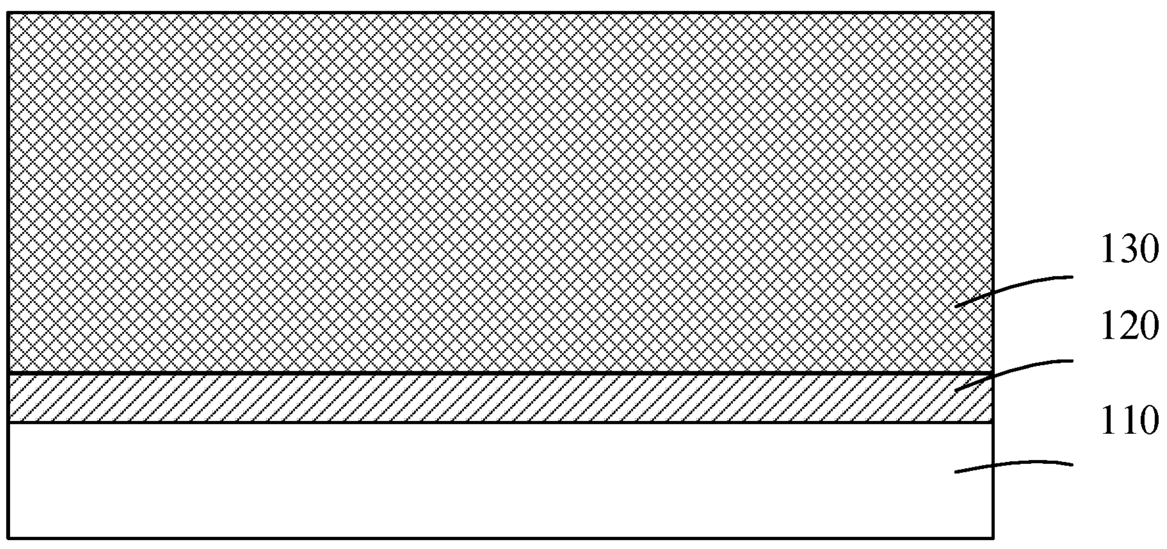
FIGS. 1-10C schematically show a process of fabricating a memory device consistent with embodiments of the disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

Unless otherwise defined, all the technical and scientific terms used herein have the same or similar meanings as generally understood by one of ordinary skill in the art. As described herein, the terms used in the specification of the present disclosure are intended to describe example embodiments, instead of limiting the present disclosure.

As used herein, when a first component is referred to as "fixed to" a second component, it is intended that the first component can be directly attached to the second component or can be indirectly attached to the second component via another component. When a first component is referred to as "connecting" to a second component, it is intended that the first component can be directly connected to the second component or can be indirectly connected to the second component via a third component between them. The terms "vertical," "horizontal," "perpendicular," "left," "right," and similar expressions used herein, are merely intended for purposes of description. The term "and/or" used herein includes any suitable combination of one or more related items listed.

In this disclosure, a value or a range of values can refer to a desired, target, or nominal value or range of values and can include slight variations. The term "about" or "approximately" associated with a value can allow a variation within, for example, 10% of the value, such as +2%, +5%, or +10% of the value, or another proper variation as appreciated by one of ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by one of ordinary skill in the art.

FIGS. 1-10C schematically show an example process of fabricating a memory device consistent with embodiments of the disclosure, which will be described in more detail below. The steps in the fabrication process are described below in a certain order. This, however, does not necessarily mean the steps must be performed in such an order. The order of certain steps can be different from that in the description below, and some steps can be performed simultaneously. Further, not all steps must be included in the fabrication process, and some steps can be omitted.

FIG. 1 is a cross-sectional view schematically showing a structure at a certain stage of the process of forming the memory device. As shown in FIG. 1, a first substrate 110 is provided. A sacrificial layer 120 and a semiconductor material layer 130 are sequentially formed over the first substrate 110. The wafer formed so far including the first substrate 110, the sacrificial layer 120, and the semiconductor material layer 130 is also referred to as a "base wafer."

The first substrate 110 is also referred to as a "growth substrate" or a "sacrificial substrate," and can be made of, e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a composite material such as silicon-on-insulator (SOI) or germanium-on-insulator (GOI), or a combination of any of the above materials.

In some embodiments, the sacrificial layer 120 can be made of an insulation material such as silicon oxide, silicon nitride, or silicon oxynitride. The semiconductor material layer 130 can be made of e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a combination of any of the above materials.

Figure 2A:
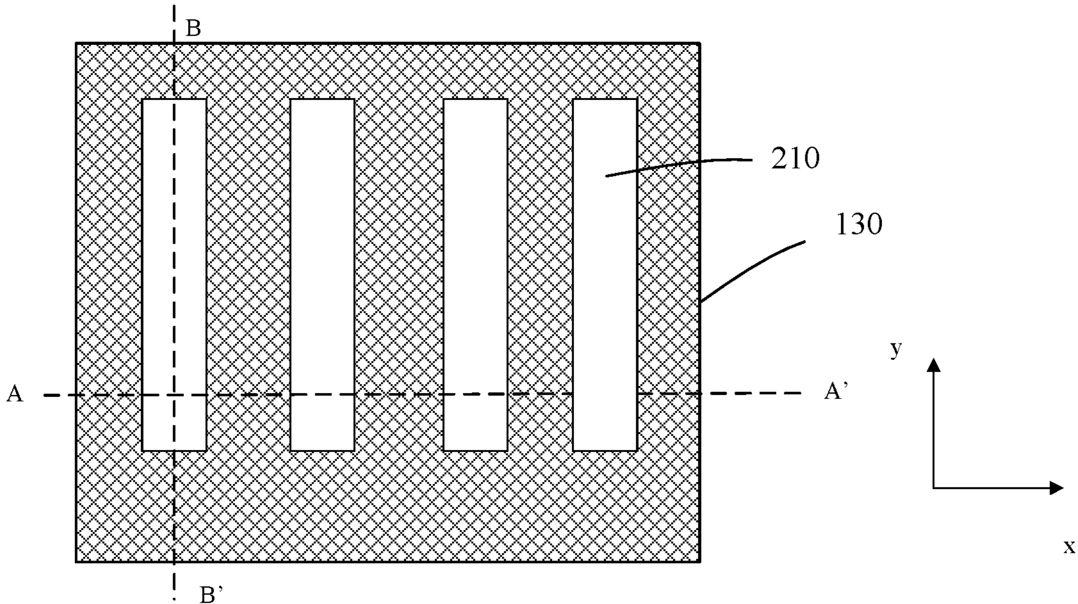
Figure 2B:
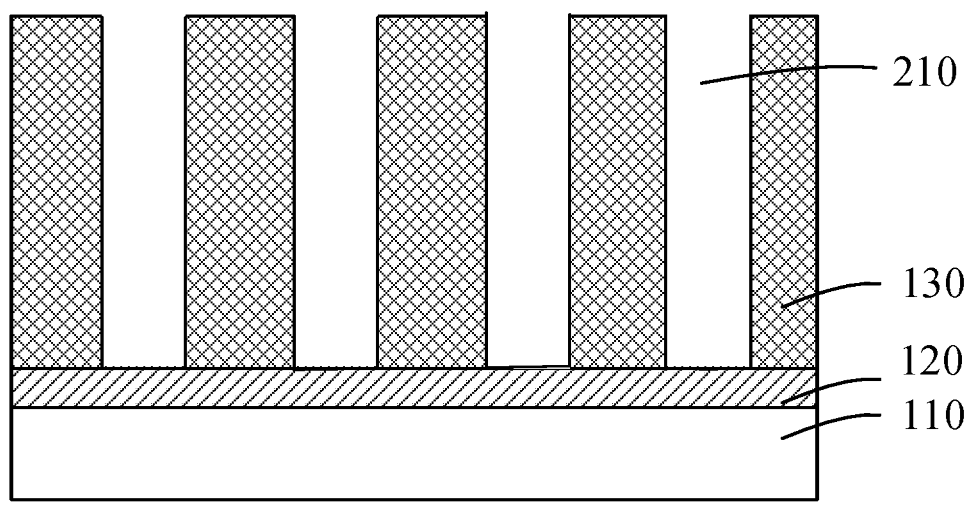
Figure 2C:
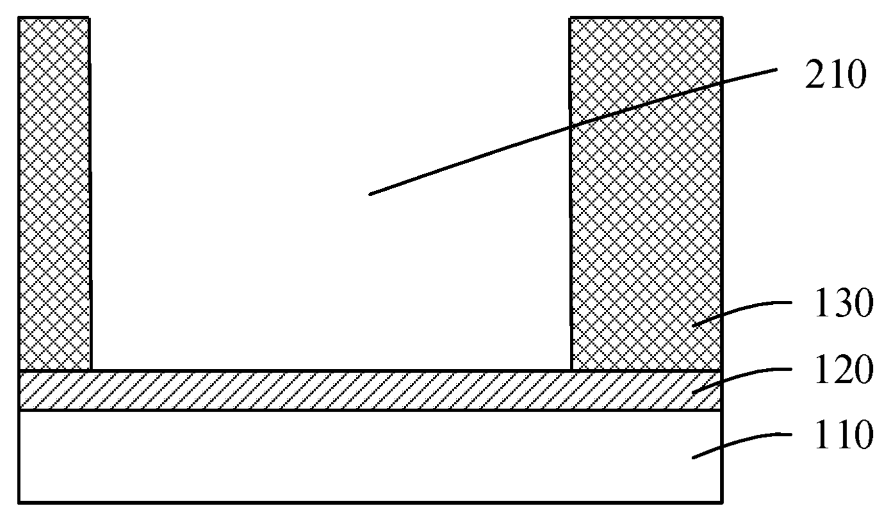

FIGS. 2A-2C schematically show another stage in the fabrication process of the memory device. FIG. 2A is a top view, FIG. 2B is a cross-sectional view along A-A' line in FIG. 2A, and FIG. 2C is a cross-sectional view along B-B' line in FIG. 2A. As shown in FIGS. 2A to 2C, a plurality of first grooves 210 are formed in the semiconductor material layer 130.

The plurality of first grooves 210 can be arranged in a row along a first direction. Each of the plurality of first grooves 210 can extend along a second direction, and the plurality of first grooves 210 can be parallel to each other.

An angle between the first direction and the second direction can be non-zero. In some embodiments, the angle between the first direction and the second direction can be approximately 90°, i.e., the first direction can be approximately perpendicular to the second direction. In the embodiments described below in connection with FIGS. 2A-10C, the first direction and the second direction are approximately perpendicular to each other, with the first direction being denoted as an x-direction and the second direction being denoted as a y-direction, such as shown in FIG. 2A. The first direction can be, e.g., a word line direction in the memory device and the second direction can be, e.g., a bit line direction in the memory device.

The plurality of first grooves 210 can penetrate through the semiconductor material layer 130, and can expose portions of a top surface of the sacrificial layer 120. That is, the plurality of first grooves 210 can extend from a top surface (first surface) of the semiconductor material layer 130 to a bottom surface (second surface) of the semiconductor material layer 130. In some embodiments, the plurality of first grooves 210 can also extend further into the sacrificial layer 120.

The plurality of first grooves 210 can be formed by photolithography and etching (wet etching or dry etching), and the etching process can include a selective etching process. For example, the etchant used to form the first grooves 210 can etch the semiconductor material layer 130 much faster than etching the sacrificial layer 120, and hence the etching process can effectively "stop" at the sacrificial layer 120.

Figure 3A:
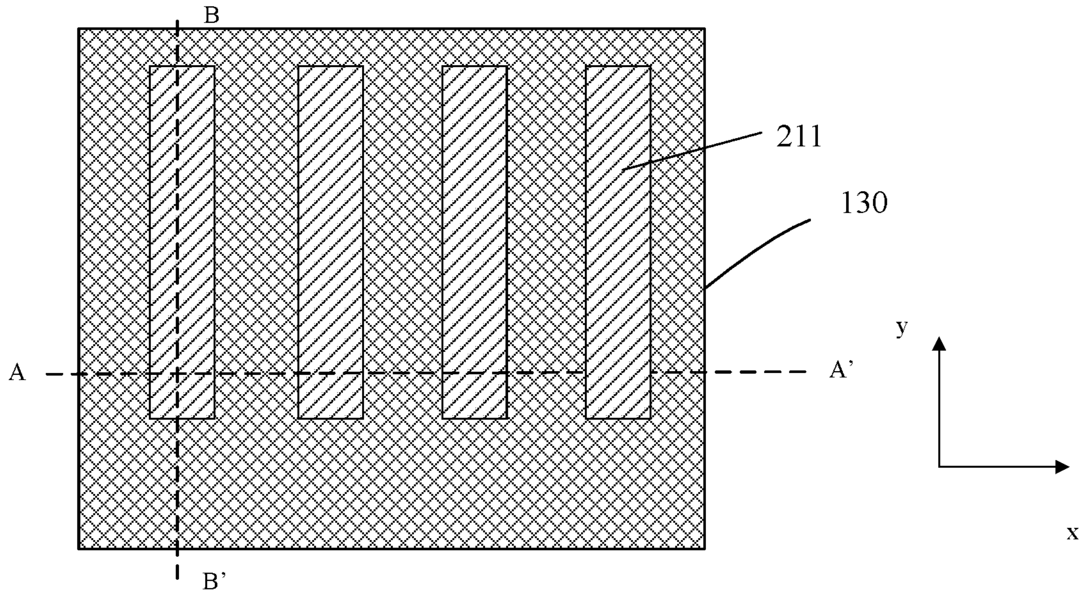
Figure 3B:
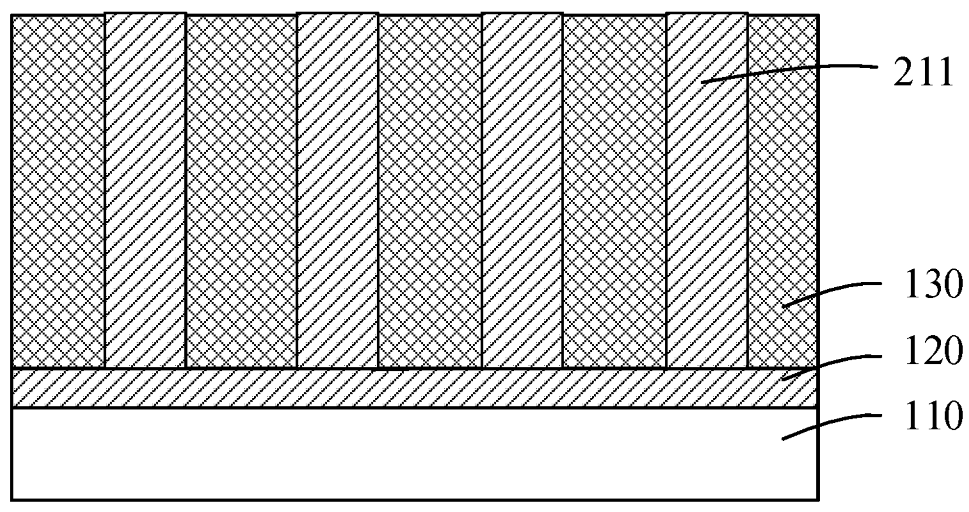
Figure 3C:
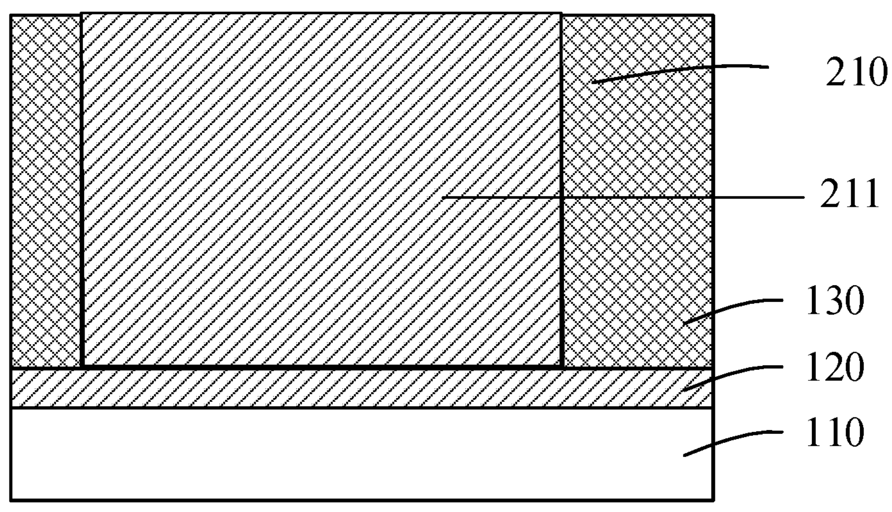

FIGS. 3A-3C schematically show another stage in the fabrication process of the memory device. FIG. 3A is a top view, FIG. 3B is a cross-sectional view along A-A' line in FIG. 3A, and FIG. 3C is a cross-sectional view along B-B' line in FIG. 3A. As shown in FIGS. 3A-3C, first spacers 211 are formed in the plurality of first grooves 210. Thus, the first spacers 211 extend from the top surface of the semiconductor material layer 130 to the bottom surface of the semiconductor material layer 130.

The first spacers 211 can be made of an insulation material such as silicon oxide, silicon nitride, or silicon oxynitride, or can be a composite layer including two or more dielectric films made of same, similar, or different materials. In some embodiments, the first spacers 211 can be formed by, e.g., depositing the material for the first spacers 211 (first spacer material) in the first grooves 210 to fill the first grooves 210. The deposition process can include, for example, a physical vapor deposition (PVD) process, a chemical vapor deposition (CVD) process, or an atomic layer deposition (ALD) process. In some other embodiments, the first spacers 211 can be formed by oxidizing the material, such as silicon, of the semiconductor material layer 130 to fill the first grooves 210. The oxidization process can include, for example, a thermal oxidization process. In some embodiments, a first spacer material layer is formed to fill the plurality of first grooves 210 and also on a top surface of the semiconductor material layer 130. Excessive first spacer material on the top surface of the semiconductor material layer 130 can be removed using a planarization process, such as etching and/or chemical-mechanical polishing (CMP), forming the first spacers 211 in the plurality of first grooves 210. In some embodiments, the top surfaces of the first spacers 211 can be flush with the top surface of the semiconductor material layer 130, as shown in FIGS. 3B and 3C. In some other embodiments, the top surfaces of the first spacers 211 do not flush with the top surface of the semiconductor material layer 130 and can be higher or lower than the top surface of semiconductor material layer 130.

Figure 4A:
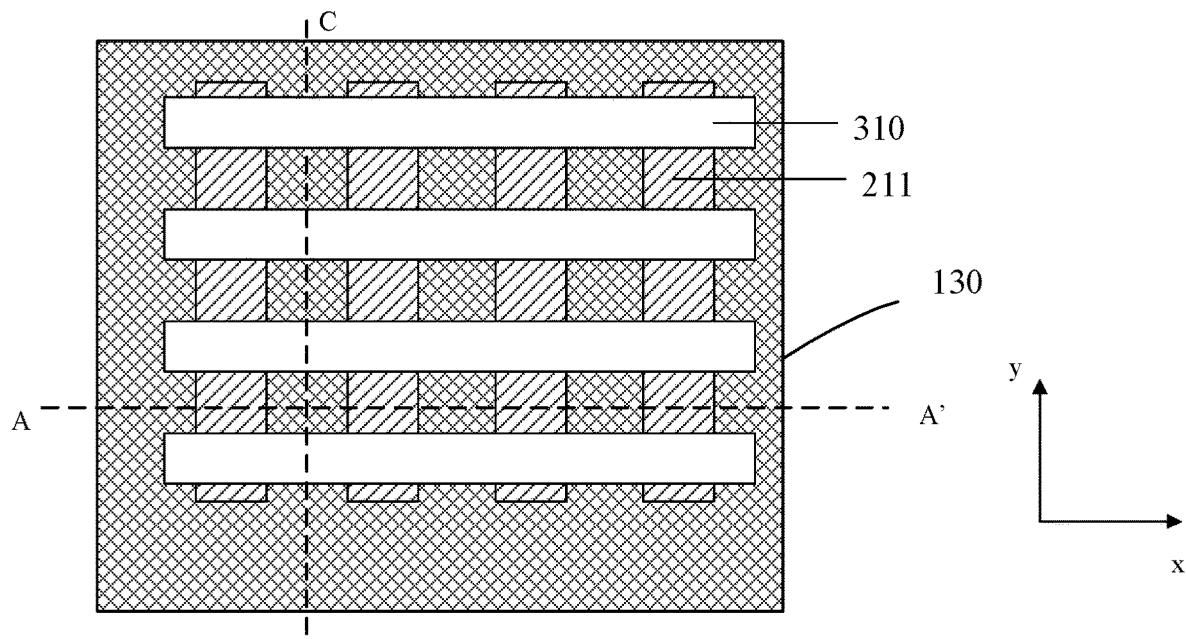
Figure 4B:
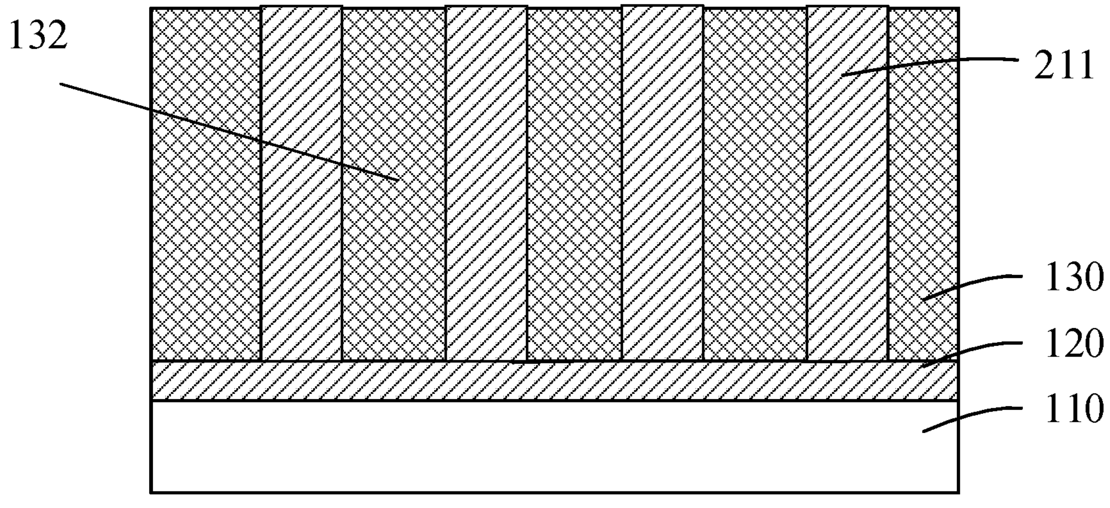
Figure 4C:
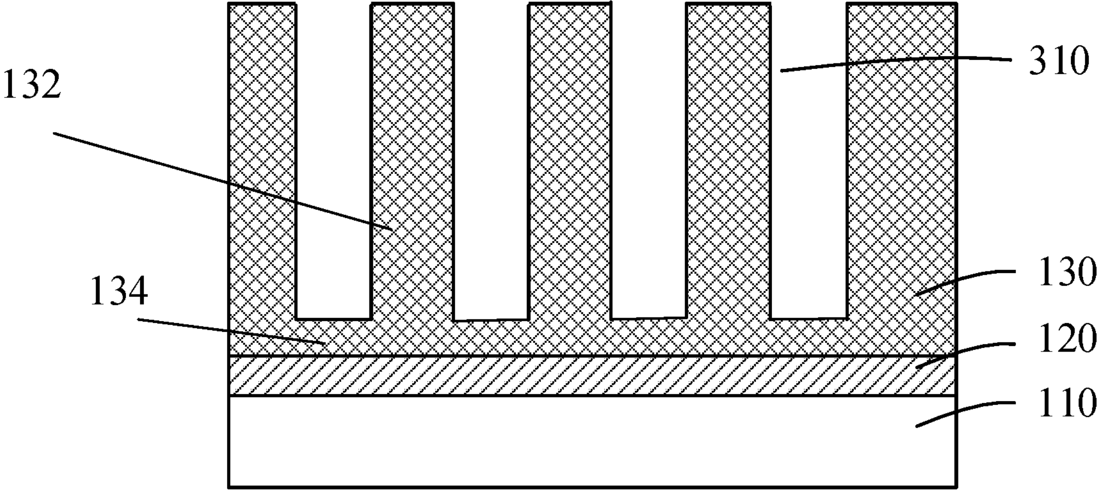

FIGS. 4A-4C schematically show another stage in the fabrication process of the memory device. FIG. 4A is a top view, FIG. 4B is a cross-sectional view along A-A' line in FIG. 4A, and FIG. 4C is a cross-sectional view along C-C' line in FIG. 4A. As shown in FIGS. 4A-4C, a plurality of second grooves 310 are formed in the semiconductor material layer 130 and the first spacers 211.

The plurality of second grooves 310 can be arranged in a row along the second direction. Each of the plurality of second grooves 310 can extend along the first direction, and the plurality of second grooves 310 can be parallel to each other. That is, as shown in FIG. 4A, the plurality of second grooves 310 can cross the first spacers 211 (hence cross the first grooves 210) and not parallel to the first spacers 211 (hence not parallel to the first grooves 210).

In the embodiments described below in connection with FIGS. 4A-10C, the first direction and the second direction are approximately perpendicular to each other, and the plurality of second grooves 310 are approximately perpendicular to the first spacers 211, with the first direction being the x-direction and the second direction being the y-direction, such as shown in FIG. 4A.

The plurality of second grooves 310 can penetrate only a portion of a thickness of the semiconductor material layer 130 and may not expose the top surface of the sacrificial layer 120, as shown in FIG. 4C. That is, each of the plurality of second grooves 310 can extend from the top surface of the semiconductor material layer 130 to a position inside the semiconductor material layer 130 and away from the bottom surface of the semiconductor material layer 130.

The plurality of second grooves 310 can be formed by photolithography and etching (wet etching or dry etching). For example, the etchant used for forming the second grooves 310 can etch both the material for the semiconductor material layer 130 and the material for the first spacers 211. The depth of the second grooves 310 (and hence the thickness of the remaining semiconductor material layer 130 and the thickness of the remaining first spacers 211 at the bottoms of the second grooves 310) can be controlled by controlling the etching conditions, such as the duration of the etching process.

As shown in FIGS. 4A-4C, at least a portion of the semiconductor material layer 130 is divided by the first grooves 210 (and hence the first spacers 210) and the second grooves 310 into a plurality of pillars 132, each of which will serve as an active area (AA) for a vertical-channel transistor of the memory device, and is also referred to as an "AA pillar" in this disclosure. In the example shown in FIGS. 4A-4C, each of the AA pillars 132 has a rectangular shape. In some other embodiments, the AA pillars 132 can have a different shape, such as a square shape. The region of the semiconductor material layer 130 constituted by the active areas can also be referred to as an "active region," i.e., the active region of the semiconductor material layer 130 can include a plurality of active areas (AA pillars 132). As shown in, e.g., FIG. 4C, since the second grooves 310 do not penetrate all the way through the semiconductor material layer 130, the remaining portions of the semiconductor material layer 130 at the bottom of the second grooves 310 form a plurality strips 134 parallel to each other in the first direction, and each extending in the second direction and connecting a corresponding column of AA pillars 132 at the bottoms of the AA pillars 132. That is, in the first direction, each strip 134 is sandwiched between two neighboring first spacers 211, while in a direction perpendicular to a surface (first surface or second surface) of the semiconductor material layer 130, each strip 134 is between bottoms of the second grooves 310 and the bottom surface of the semiconductor material layer 130. These strips 134 are also referred to as "semiconductor material strips" or "semiconductor material strips."

Figure 5A:
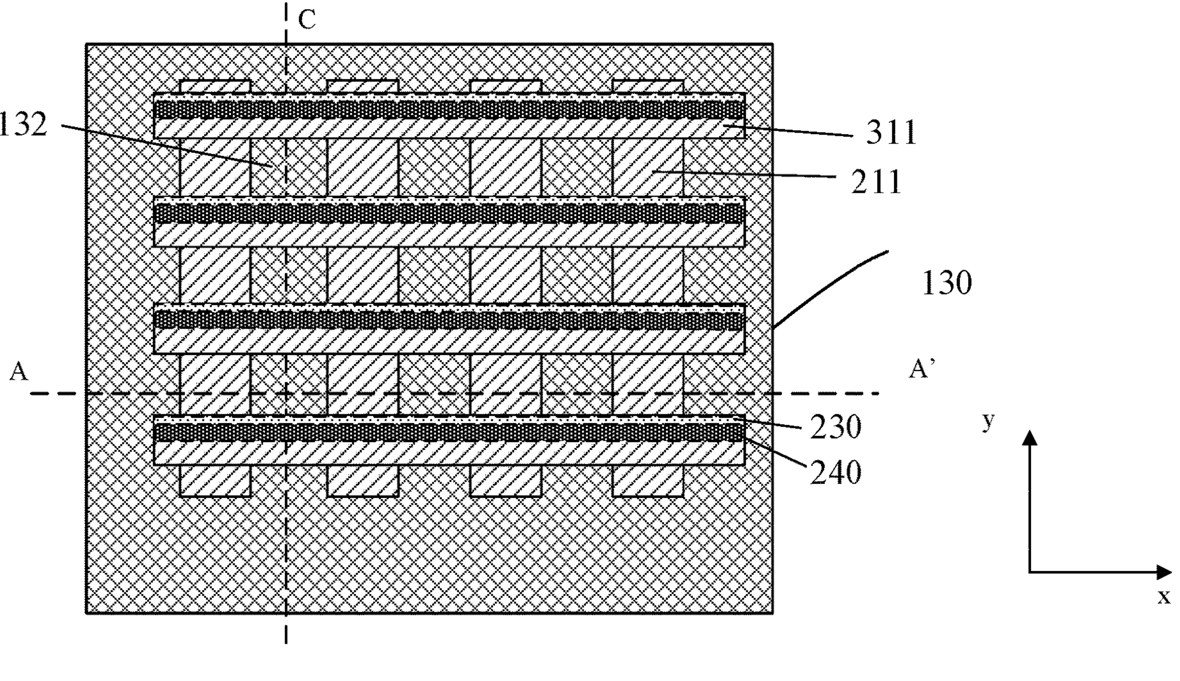
Figure 5B:
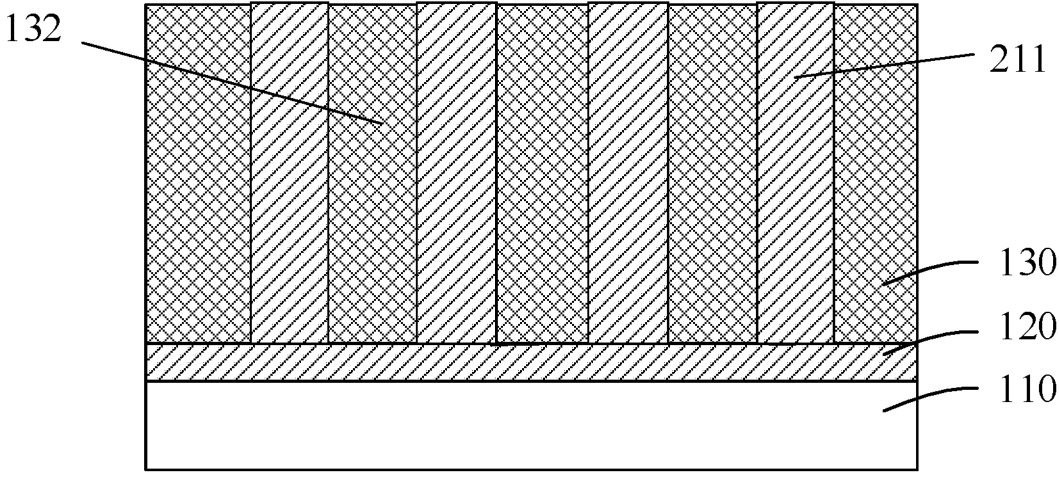
Figure 5C:
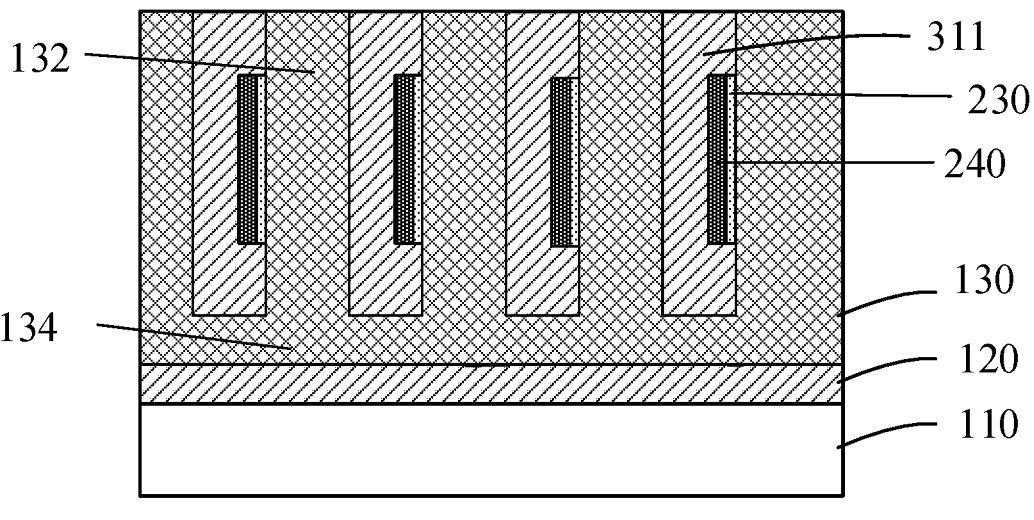

FIGS. 5A-5C schematically show another stage in the fabrication process of the memory device. FIG. 5A is a top view, FIG. 5B is a cross-sectional view along A-A' line in FIG. 5A, and FIG. 5C is a cross-sectional view along C-C' line in FIG. 5A. As shown in FIG. 5C, a gate dielectric layer 230 is formed at a sidewall of each of the plurality of second grooves 310 (part of which is also a sidewall of a corresponding AA pillar 132). As shown in, e.g., FIG. 4A, the second grooves 310 not only cut into the semiconductor material layer 130 to form the AA pillars 132, but also cut into the first spacers 211, forming a plurality of first spacer pillars. A portion of a sidewall of each of the first spacer pillars is also exposed, and the gate dielectric layer 230 can also be formed on the exposed portion of the sidewall of a first spacer pillar. In some embodiments, the gate dielectric layers 230 can include a dielectric material, such as silicon oxide, silicon nitride, or silicon oxynitride, or can be a composite layer including two or more dielectric films made of same, similar, or different materials. Further, the gate dielectric layers 230 can be formed by depositing the dielectric material on the sidewalls of the plurality of AA pillars 132, or can be formed by, e.g., oxidizing portions of the sidewalls of the AA pillars 132, e.g., via thermal oxidization. In some embodiments, the gate dielectric layers 230 can be a composite layer including two or more dielectric films made of same, similar, or different materials.

As shown in FIG. 5C, a gate electrode layer 240 is formed on the gate dielectric layer 230. The gate electrode layer 240 can be formed by deposited, e.g., by PVD, CVD, or ALD, onto the gate electrode layer 240, and can be made of a conductive material, such as polysilicon or metal, where the metal can include, e.g., copper, aluminum, tungsten, or a combination thereof.

Further, a second spacer 311 is formed in each second groove 310. Thus, each second spacer 311 extends from the top surface of the semiconductor material layer 130 to a position inside the semiconductor material layer 130 and away from the bottom surface of the semiconductor material layer 130. That is, in the direction perpendicular to a surface (first surface or second surface) of the semiconductor material layer 130, each semiconductor material strip 134 is between bottoms of the second spacers 311 and the bottom surface of the semiconductor material layer 130. The gate dielectric layer 230 and the gate electrode layer 240 are embedded in the corresponding second spacer 311.

The gate dielectric layers 230 and the gate electrode layer 240 are also illustratively shown in FIG. 5A using dashed lines, while in reality they may not be seeable from the top view in FIG. 5A because they are covered by the second spacers 311.

The second spacers 311 can be made of an insulation material such as silicon oxide, silicon nitride, or silicon oxynitride, or can be a composite layer including two or more dielectric films made of same, similar, or different materials. Top surfaces of the second spacers 311 can be flush with the top surface of the semiconductor material layer 130.

In some embodiments, formation of the second spacers 311 can include, e.g., depositing the material for the second spacers 311 (second spacer material) in the second grooves 310 to fill the second grooves 310. The deposition process can include, for example, a PVD process, a CVD process, or an ALD process. In some other embodiments, the formation of the second spacers 311 can include oxidizing the material, such as silicon, of the semiconductor material layer 130 to fill the second grooves 310. The oxidization process can include, for example, a thermal oxidization process. In some embodiments, a second spacer material layer is formed to fill the plurality of second grooves 310 and also on a top surface of the semiconductor material layer 130. Excessive second spacer material on the top surface of the semiconductor material layer 130 can be removed using a planarization process, such as etching and/or CMP, forming the second spacers 311 in the plurality of second grooves 310. In some embodiments, the top surfaces of the second spacers 311 can be flush with the top surface of the semiconductor material layer 130, as shown in FIGS. 5B and 5C. In some other embodiments, the top surfaces of the second spacers 311 do not flush with the top surface of the semiconductor material layer 130 and can be higher or lower than the top surface of semiconductor material layer 130.

An example process for forming the structure shown in FIGS. 5A-5C is as follows. First, a silicon oxide-silicon nitride-silicon oxide composite layer is deposited in each of the second grooves 310. Then the silicon nitride layer is removed by selective etching using an etchant that can etch silicon nitride much faster than etching silicon oxide, forming void in each second groove 310 and exposing a portion of a sidewall of the corresponding AA pillar 132. After that, the gate dielectric layer 230 and the gate electrode layer 240 are sequentially formed on the exposed portion of the sidewall of the AA pillar 132. Finally, additional dielectric material, such as silicon oxide, is formed in the void to fill the space not occupied by the gate dielectric layer 230 and the gate electrode layer 240. The filled-in additional dielectric material, together with the silicon oxide layers from the composite layer, can form the second spacer 311.

The gate dielectric layer 230 and the gate electrode layer 240 together form a gate structure of a vertical-channel transistor in the memory device. In the example shown in FIG. 5C, the gate structure is formed on one sidewall of the AA pillar 132. In some other embodiments, the gate structure can be formed on more sidewalls of the AA pillar 132, such as two opposite sidewalls in the second direction.

As described above, the first spacers 211 can be parallel to each other and arranged in a row along the first direction. The second spacers 311 can be parallel to each other and arranged in a row along the second direction. The first spacers 211 can intersect the second spacers 311 (i.e., not parallel to the second spacers 311), and can together define the plurality of active areas (AA pillars 132) in the semiconductor material layer 130. The plurality of active areas (AA pillars 132) can be arranged in an array expanding along the first direction and the second direction. That is, the plurality of active areas (AA pillars 132) can be considered as including one or more columns of active areas (AA pillars 132) arranged along the first direction and each extending in the second direction; or the plurality of active areas (AA pillars 132) can be considered as including one or more rows of active areas arranged along the second direction and each extending in the first direction. One gate dielectric layer 230 and one corresponding gate electrode layer 240 can be located on a side wall of one corresponding active area (AA pillar 132). The gate electrode layers 240 of each row of active areas (AA pillars 132) can be connected, for example, via portions of the gate electrode layer formed on the sidewalls of the first spacer pillars as described above, to form a word line of the memory device.

Figure 6A:
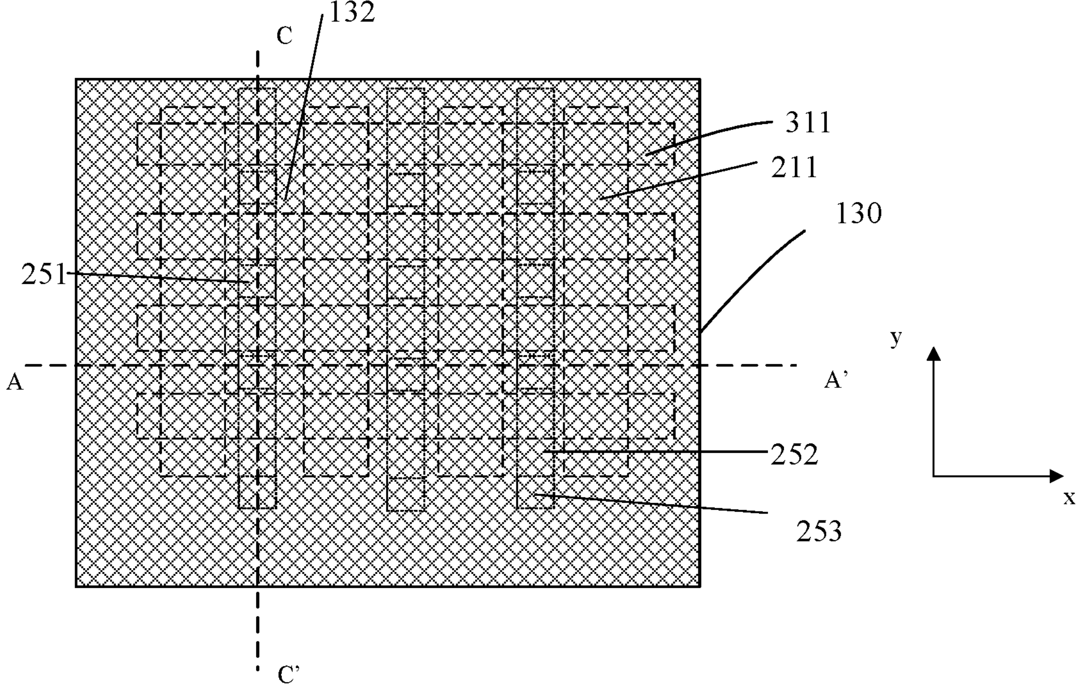
Figure 6B:
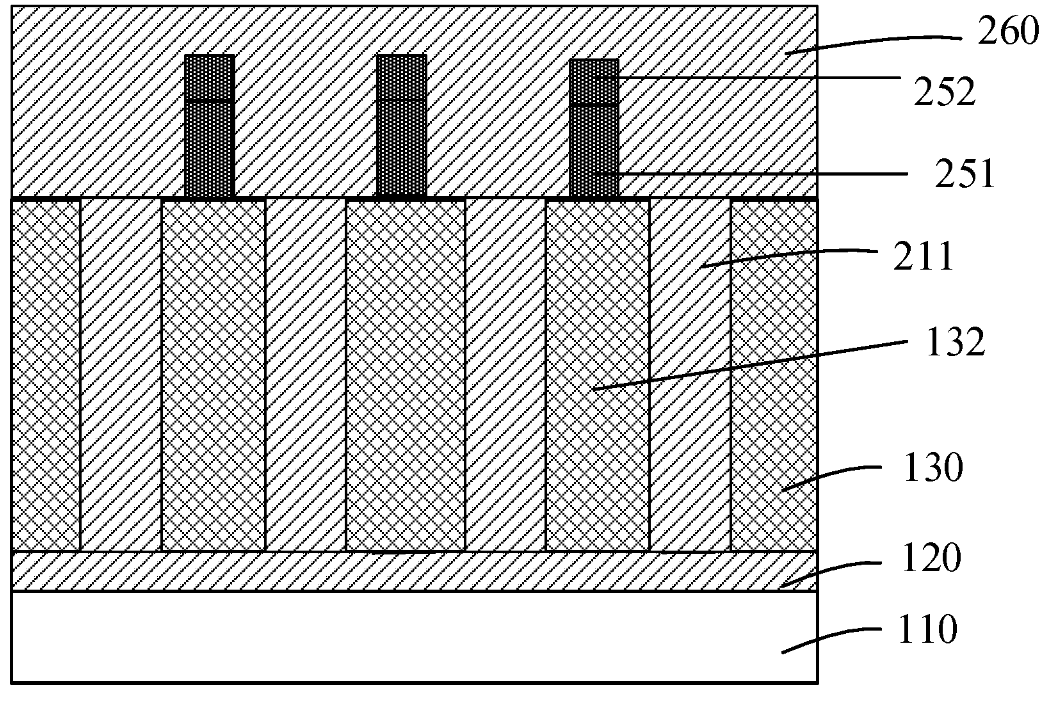
Figure 6C:
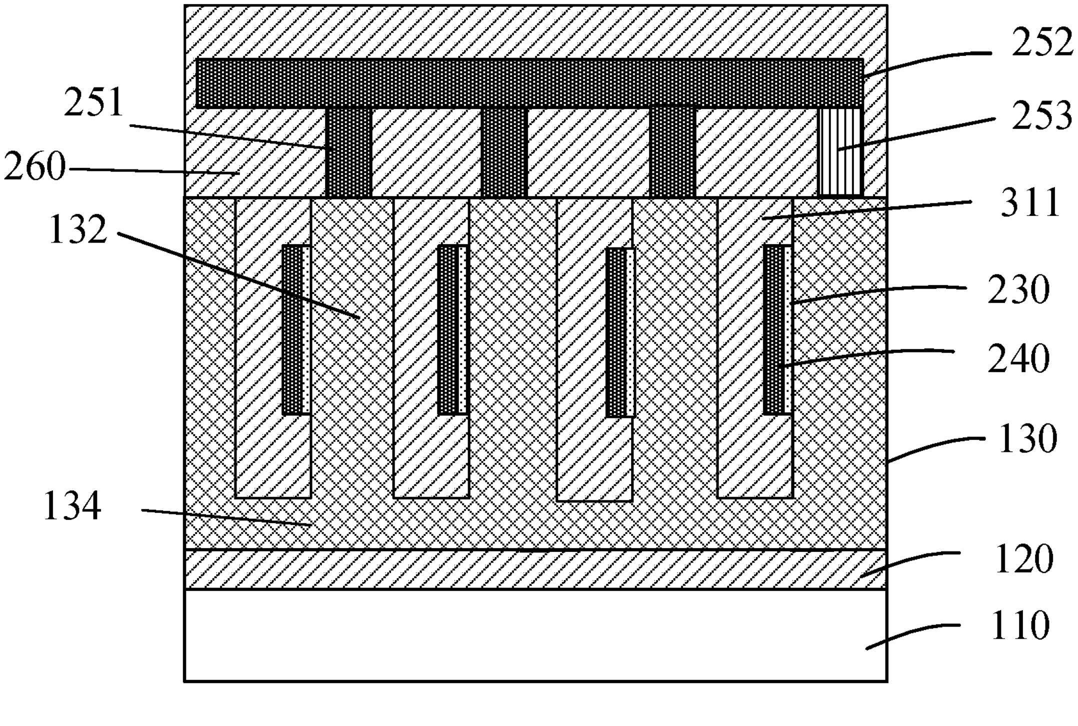

FIGS. 6A-6C schematically show another stage in the fabrication process of the memory device. FIG. 6A is a top view, FIG. 6B is a cross-sectional view along A-A' line in FIG. 6A, and FIG. 6C is a cross-sectional view along C-C' line in FIG. 6A. As shown in FIGS. 6B and 6C, a first conductive structure 251 (AA pick up for the vertical-channel transistor) is formed on the top surface of each of the plurality of active areas (AA pillars 132) of the semiconductor material layer 130, and a second conductive structure 252 is formed on top surfaces of each column of first conductive structures 251 to electrically couple the first conductive structures 251. Each first conductive structure 251 can have a pillar shape, and each second conductive structure 252 can have a strip shape.

In addition, as shown in FIG. 6C, a plurality of third conductive structures 253 are also formed on the top surface of a region of the semiconductor material layer 130 outside the active region. Each of the third conductive structures 253 can have a pillar shape and be electrically coupled to a column of first conductive structures 251 via a corresponding second conductive structure 252. The second conductive structures 252 are arranged along the first direction and each second conductive structure 252 extends along the second direction. The second conductive structures 252 can be approximately parallel to each other. Each of the plurality of active areas (AA pillars 132) can be electrically coupled to a corresponding one of the first conductive structures 251. One column of first conductive structures 251 corresponding to one column of active areas AA can be electrically coupled to a corresponding second conductive structure 252. A first insulation layer 260 is formed on the top surface of the semiconductor material layer 130. The first conductive structures 251, the second conductive structures 252, and the third conductive structures 253 can be embedded in the first insulation layer 260.

The first conductive structures 251 and the second conductive structures 252 can be formed by various suitable methods. In some embodiments, the first insulation layer 260 (or a portion thereof) can be deposited over the semiconductor material layer 130. After that, a plurality of holes for the first conductive structures 251 and the third conductive structures 253 can be formed in the first insulation layer 260 by photolithography and etching to expose at least portions of top surfaces of the plurality of active areas (AA pillars 132), and then a plurality of trenches for the second conductive structures 252 can be formed in the first insulation layer 260 by photolithography and etching, where each trench can be aligned with a column of holes. Alternatively, the plurality of trenches for the second conductive structures 252 can be formed first and the plurality of holes for the first conductive structures 251 and the third conductive structures 253 can then be formed in the trench and into the first insulation layer 260 to expose portions of top surfaces of the plurality of active areas (AA pillars 132). Once the holes and trenches are formed, a conductive material can be filled therein to form the first conductive structures 251, the second conductive structures 252 together. In some other embodiments, the first conductive structures 251 and the third conductive structures 253 can be formed first by lithography/etching and filling corresponding conductive material and the second conductive structures 252 can be then formed by lithography/etching and filling corresponding conductive material; or the second conductive structures 252 can be formed first by lithography/etching and filling corresponding conductive material and the first conductive structures 251 and the third conductive structures 253 can then be formed by lithography/etching and filling corresponding conductive material.

In some embodiments, after the first conductive structures 251, the second conductive structures 252, and the third conductive structures 253 are formed, additional insulation material for the first insulation layer 260 can be deposited to bury the first conductive structures 251, the second conductive structures 252, and the third conductive structures 253, such that the first conductive structures 251, the second conductive structures 252, and the third conductive structures 253 are embedded in the final first insulation layer 260.

Each of the first conductive structures 251, the second conductive structures 252, and the third conductive structures 253 can be made of a conductive material, such as polysilicon or metal, and the metal can include copper, aluminum, tungsten, or a combination thereof. The conductive materials for the first conductive structures 251, the second conductive structures 252, and the third conductive structures 253 can be the same as or different from each other. For example, the first conductive structures 251, the second conductive structures 252, and the third conductive structures 253 can be made of tungsten.

The first insulation layer 260 can be made of a dielectric material, such as silicon oxide, silicon nitride, or silicon oxynitride, or can be a composite layer including two or more dielectric films made of same, similar, or different materials.

In FIG. 6A, the first spacers 211, the second spacers 311, the AA pillars 132, the first conductive structures 251, the second conductive structures 252, and the third conductive structures 253 are indicated using dashed lines for illustrative purposes, while in reality they may not be seeable from the top view in FIG. 6A.

Figure 7A:
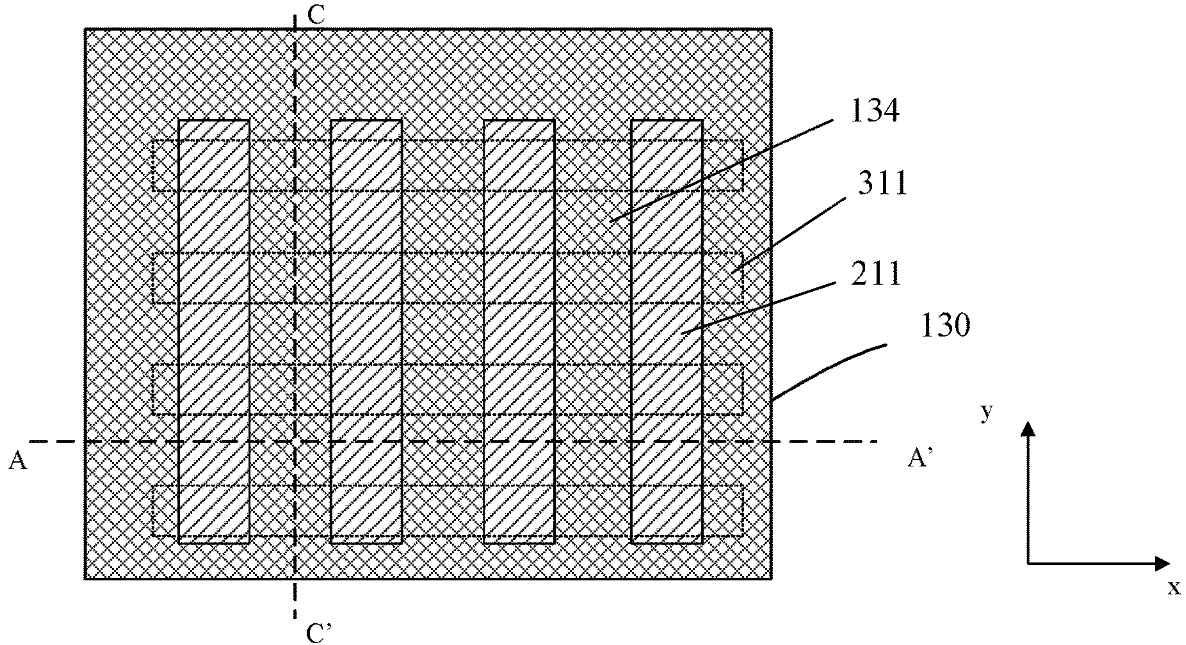
Figure 7B:
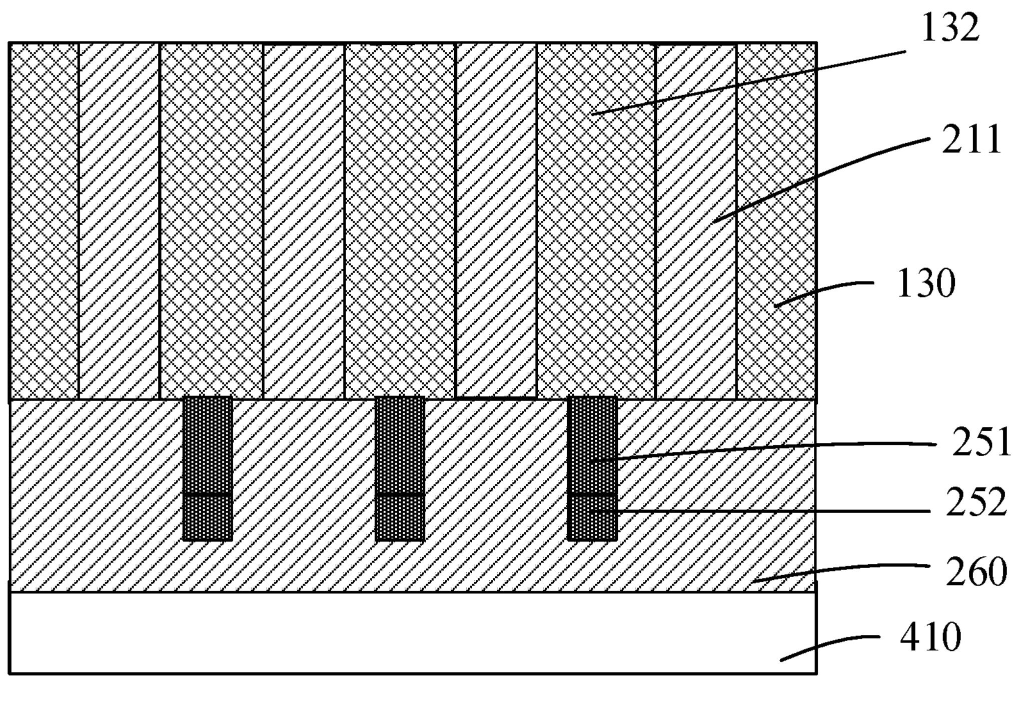
Figure 7C:
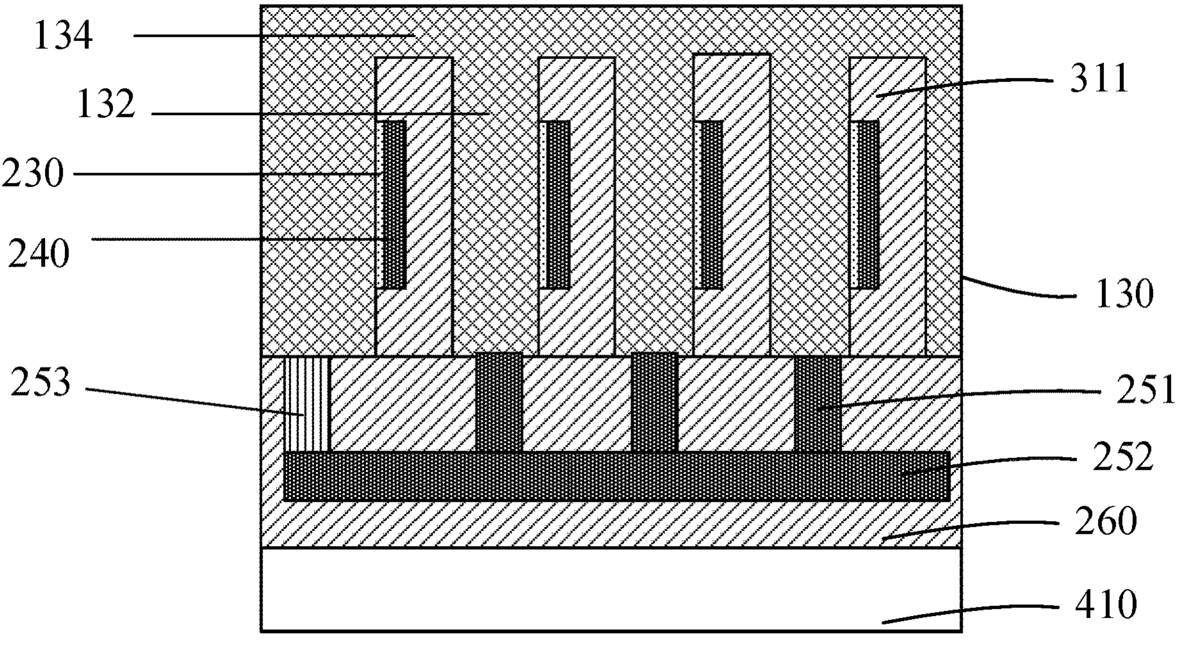

FIGS. 7A-7C schematically show another stage in the fabrication process of the memory device. FIG. 7A is a top view (note the viewing direction in FIG. 7A, as well as that in subsequent FIGS. 8A, 9A, and 10A) is opposite to that in FIGS. 2A, 3A, 4A, 5A, and 6A), FIG. 7B is a cross-sectional view along A-A' line in FIG. 7A, and FIG. 7C is a cross-sectional view along C-C' line in FIG. 7A. In FIG. 7A, the second spacers 311 are indicated using dashed lines for illustrative purposes, while in reality they may not be seeable from the top view in FIG. 7A.

Consistent with the disclosure, after the first conductive structures 251, the second conductive structures 252, and the third conductive structures 253 are formed, the entire wafer (the wafer formed so far is also referred to as an "intermediate wafer") is flipped and bonded to a second substrate 410, also referred to as a "carrier substrate." After the wafer is bonded to the second substrate 410, the first insulation layer 260 is proximal to the second substrate 410 (as shown in FIGS. 7B and 7C), while the first substrate 110 is distal from the second substrate 410. In some embodiments, a bonding interface can be formed between the first insulation layer 260 and the second substrate 410.

The second substrate 410 can be made of, e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a composite material such as silicon-on-insulator (SOI) or germanium-on-insulator (GOI), or a combination of any of the above materials.

After the wafer is bonded to the second substrate 410, the first substrate 110 and the sacrificial layer 120 are removed such that another surface (which would be a bottom surface in FIGS. 2A-6C) of the semiconductor material layer 130 away from the first conductive structures 251 are exposed, as shown in FIGS. 7A-7C. The first substrate 110 and the sacrificial layer 120 can be removed by, e.g., a CMP method and/or an etching method.

Figure 8A:
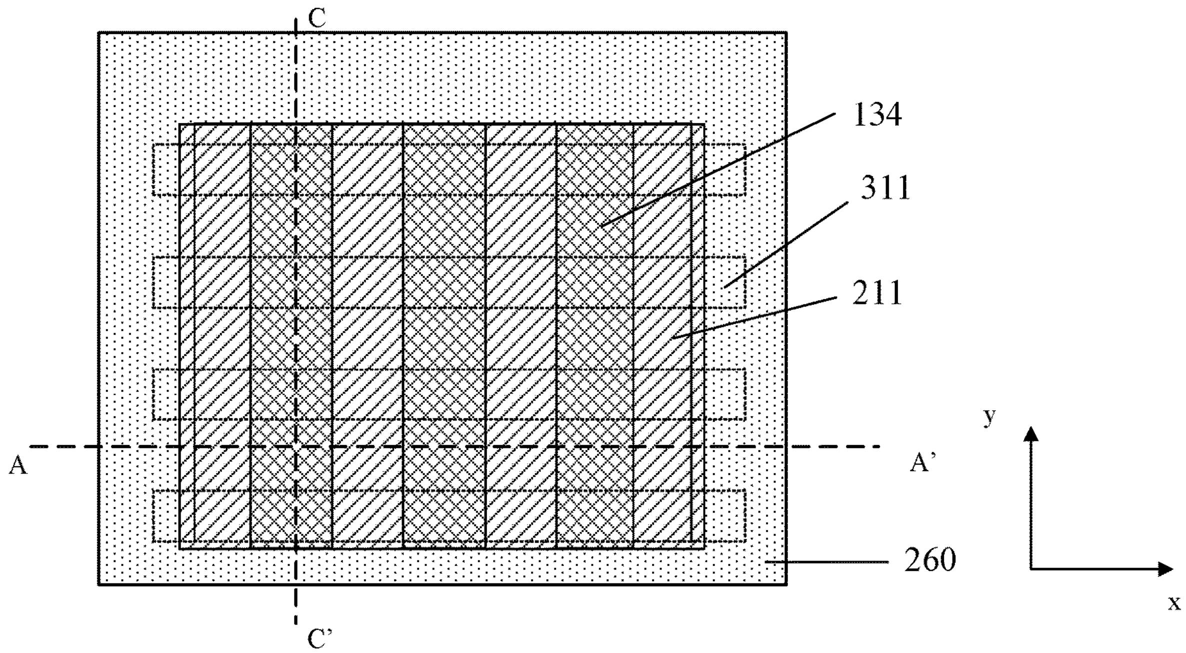
Figure 8B:
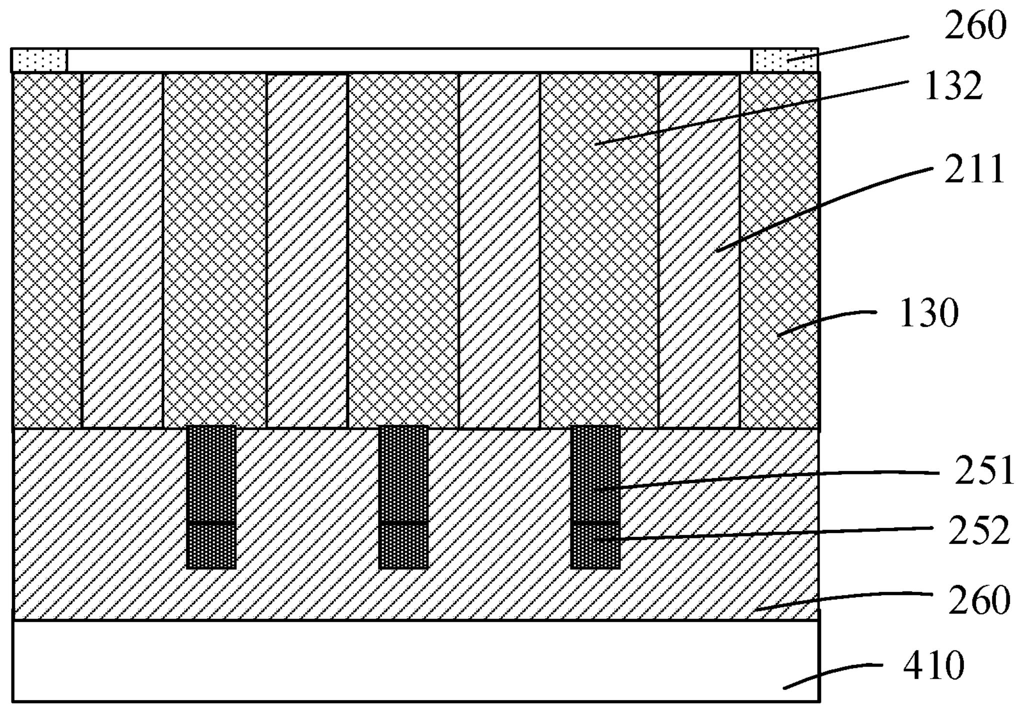
Figure 8C:
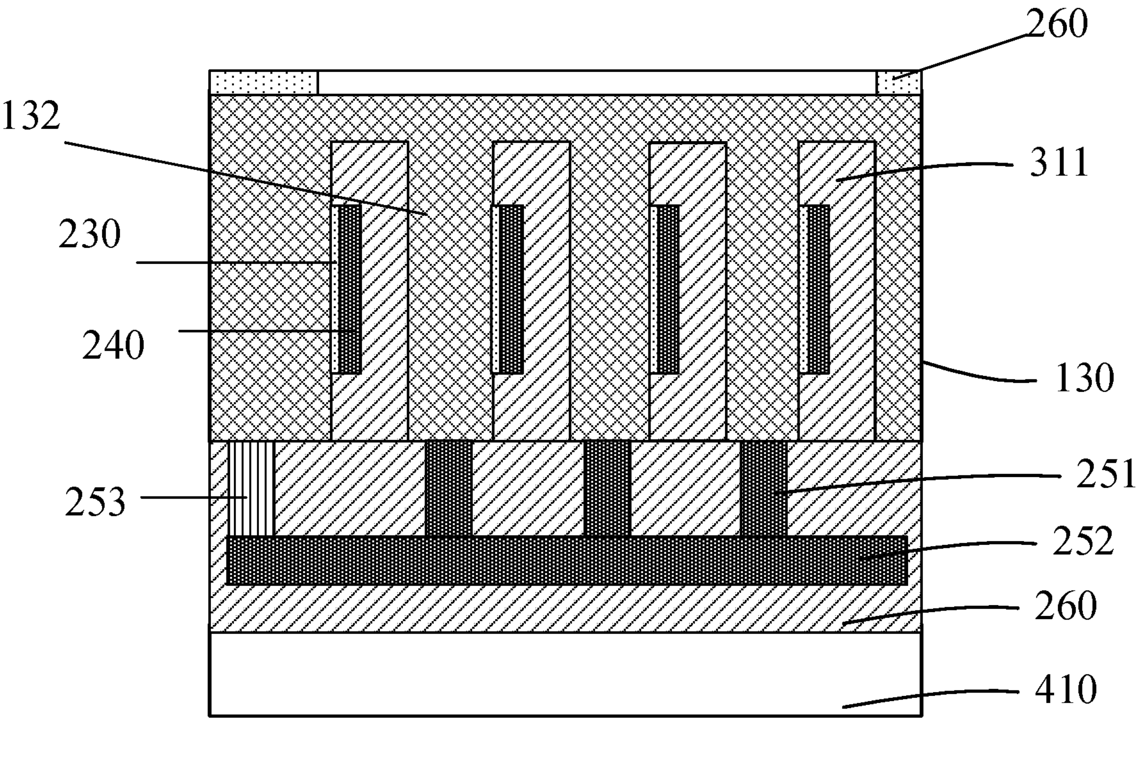

FIGS. 8A-8C schematically show a next stage in the fabrication process of the memory device. FIG. 8A is a top view, FIG. 8B is a cross-sectional view along A-A' line in FIG. 8A, and FIG. 8C is a cross-sectional view along C-C' line in FIG. 8A. Similar to FIG. 7A, in FIG. 8A, the second spacers 311 are indicated using dashed lines for illustrative purposes, while in reality they may not be seeable from the top view in FIG. 8A.

As shown in FIGS. 8A-8C, a mask layer 260 is formed over the semiconductor material layer 130 and the first spacers 211, and is then patterned to open a window that exposes the active region, and hence exposes the semiconductor material strips 134 each connecting a corresponding column of AA pillars 132. The mask layer 260 can include a photolithography resist layer or a hard mask layer made of, e.g., a dielectric material, such as silicon oxide, silicon nitride, or silicon oxynitride.

Figure 9A:
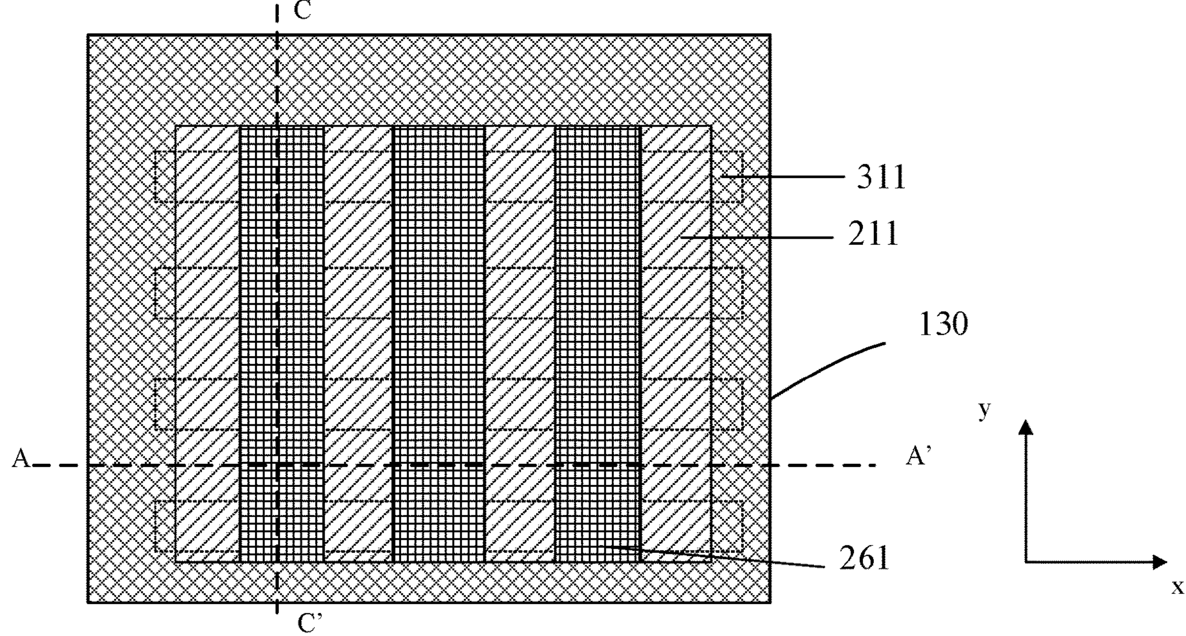
Figure 9B:
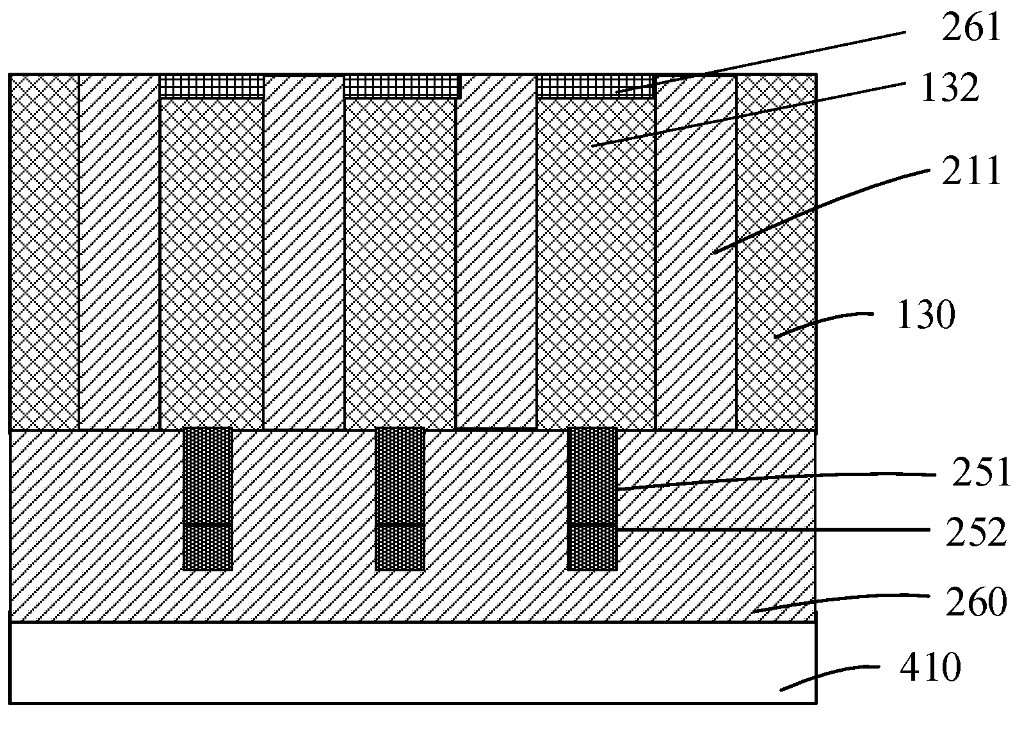
Figure 9C:
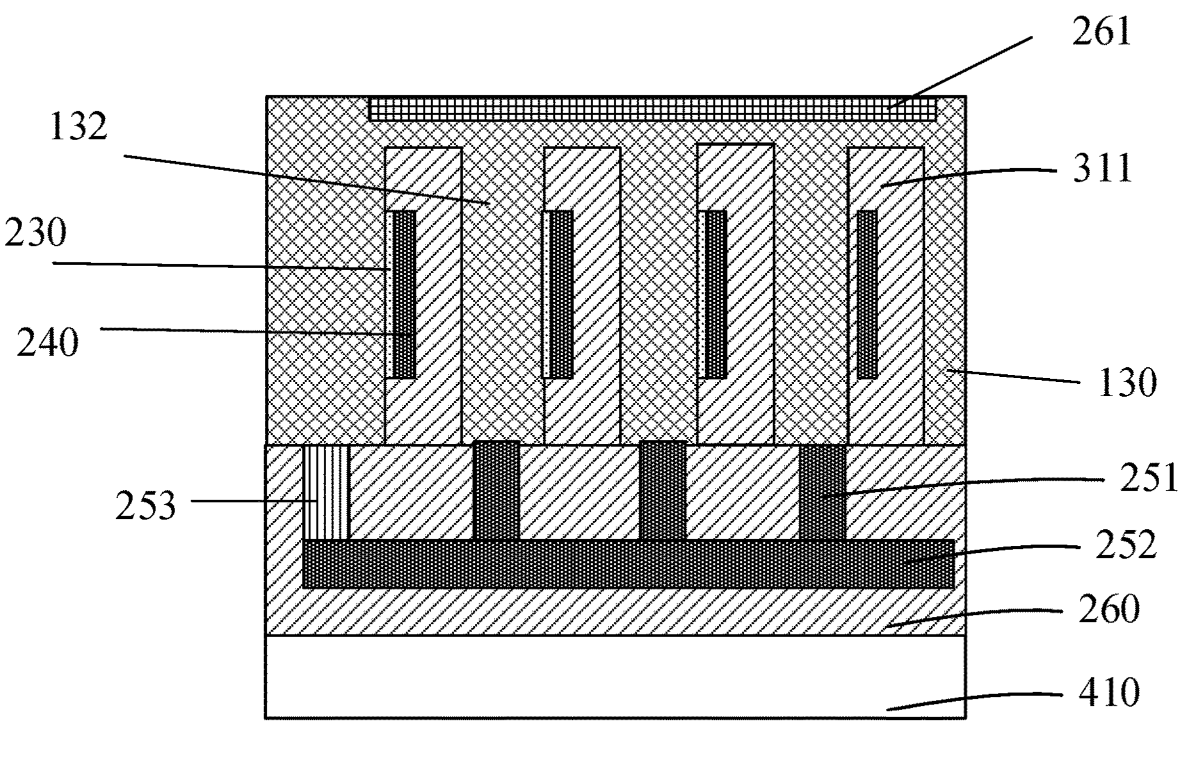

FIGS. 9A-9C schematically show a next stage in the fabrication process of the memory device. FIG. 9A is a top view, FIG. 9B is a cross-sectional view along A-A' line in FIG. 9A, and FIG. 9C is a cross-sectional view along C-C' line in FIG. 8A. Similar to FIGS. 7A and 8A, in FIG. 9A, the second spacers 311 are indicated using dashed lines for illustrative purposes, while in reality they may not be seeable from the top view in FIG. 9A.

As shown in FIGS. 9A-9C, silicidation is conducted, which converts at least a portion of each semiconductor material strips 134 into a silicide layer 261 (also referred to as a "silicide strip"). The process described above and below with in connection with FIGS. 8A-9C for silicidizing the semiconductor material strips 134 can be collectively referred to as a silicidation process.

The silicide layers 261 can be considered "embedded" in the semiconductor material layer 130. In the example shown in FIGS. 9A-9C, an upper portion of a semiconductor material strip 134 is converted into a corresponding silicide layer 261, and the silicide layer 261 does not contact the second spacers 311. In some other embodiments, the entire semiconductor material strip 134 can be silicidized (i.e., the semiconductor material strip 134 can be entirely silicidized) and the silicide layer 261 can contact the second spacers 311. Consistent with the disclosure, the bottom surface of the silicide layer 261 can be higher than, flush with, or lower than the upper surfaces of the second spacers 311 (in the orientation shown in FIGS. 9B and 9C).

In some embodiments, silicidation can include depositing a layer of metal material, such as aluminum, cobalt, titanium, tungsten, tantalum, or molybdenum, onto the exposed semiconductor material strips 134 (i.e., in the window), followed by a heat treatment, to convert silicon in at least a portion of each semiconductor material strip 134 into silicide. The excess metal material can then be removed.

Since the silicide layers 261 are formed by at least partially silicidizing the semiconductor material strips 134, which, by the nature of their formation, are each aligned with a column of AA pillars 132, the silicide layers 261 are also each automatically aligned with a corresponding column of AA pillars 132. That is, the silicide layers 261 are "self-aligned." With this process, even distortion occurs during the fabrication process and some AA pillars 132 in one column do not form a straight line as designed, the corresponding semiconductor material strip 134 and hence the corresponding silicide layer 261 formed therefrom will exhibit similar distortion and still be aligned with the column of AA pillars 132. Thus, good electrical connection among the column of AA pillars 132 can be maintained. As such, broken circuit and resistance increasing can be avoided or minimized.

Figure 10A:
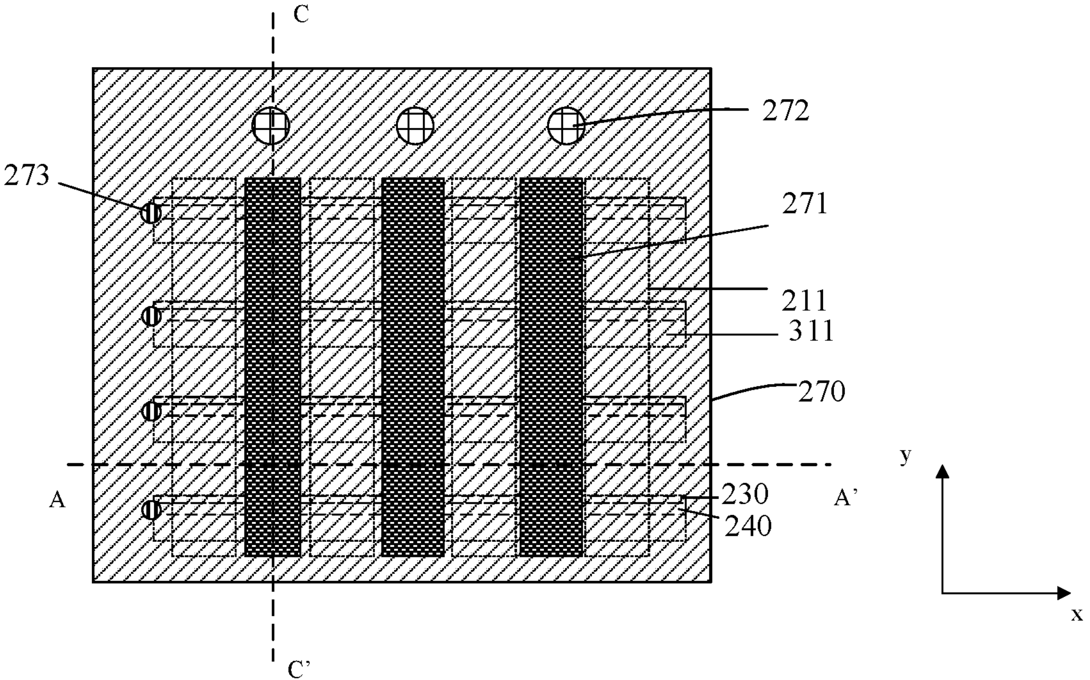
Figure 10B:
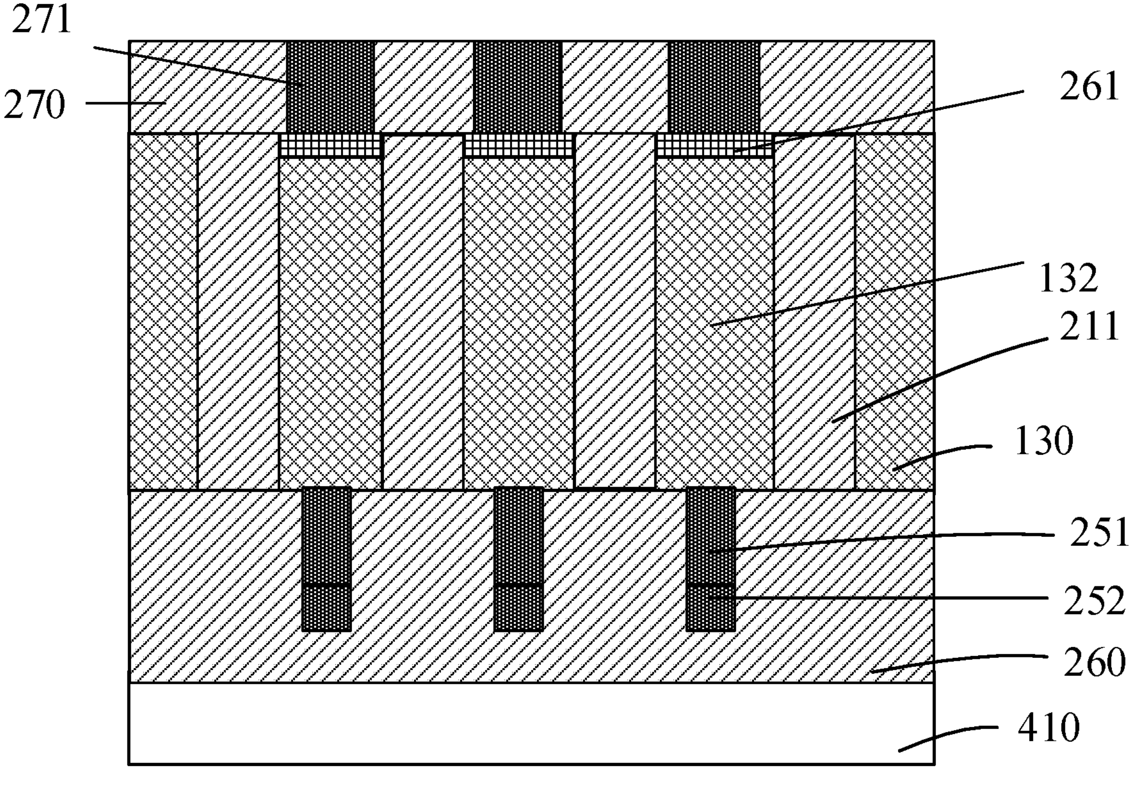
Figure 10C:
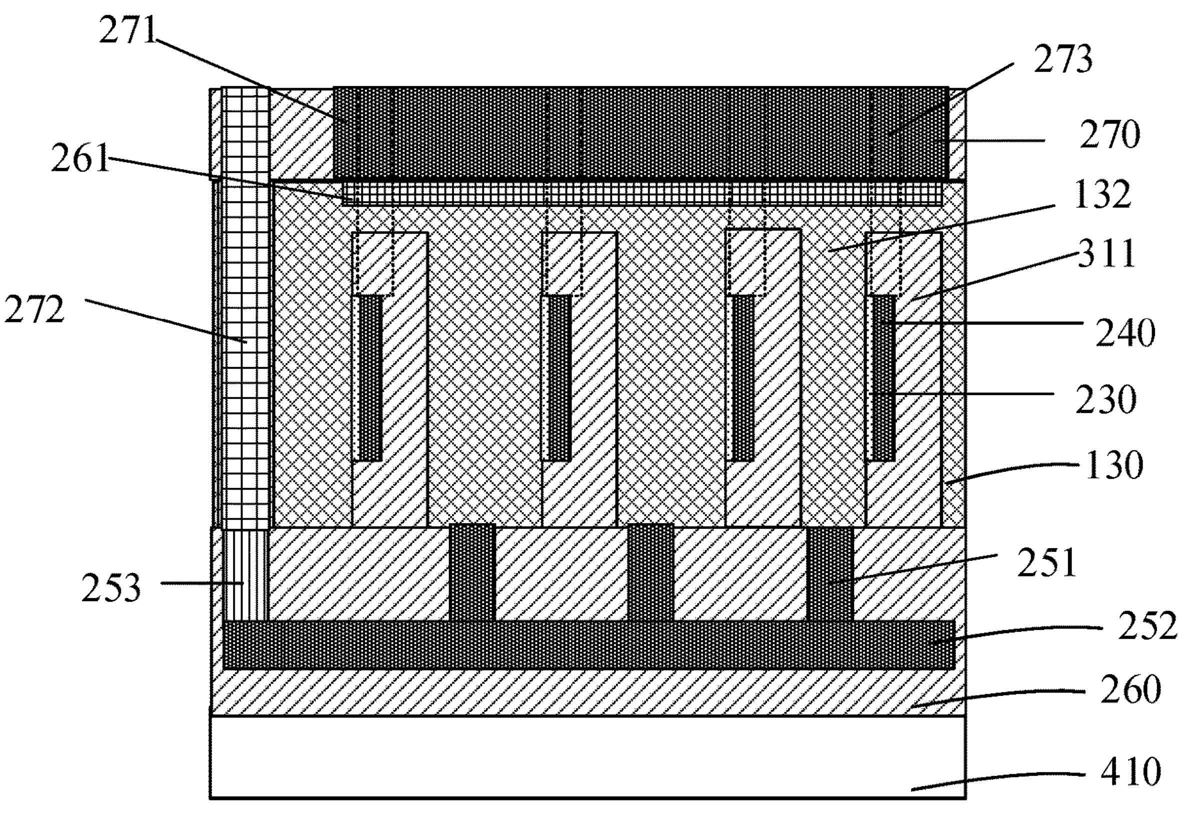

FIGS. 10A-10C schematically show another stage in the fabrication process of the memory device. FIG. 10A is a top view, FIG. 10B is a cross-sectional view along A-A' line in FIG. 10A, and FIG. 10C is a cross-sectional view along C-C' line in FIG. 10A. In FIG. 10A, the gate dielectric layer 230, the gate electrode layers 240, the first spacers 211, the second spacers 311 are indicated using dashed lines for illustrative purposes, while in reality they may not be seeable from the top view in FIG. 10A.

As shown in FIGS. 10A-10C, a second insulation layer 270, first lead-out structures 271, second lead-out structures 272, and third lead-out structures 273 are formed. These lead-out structures serve to electrically coupling embedded structures to other parts of the memory device.

The first lead-out structures 271 are formed at positions on the top surfaces of the silicide layers 261 corresponding to the plurality of AA pillars 132. The first lead-out structures 271 can be, e.g., bit line pick-ups. The shape of a first lead-out structure 271 can be a strip shape, similar to that of a silicide layer 261. Because a silicide layer 261 connects and electrically couples a column of AA pillars 132, as long as the first lead-out structure 271 can contact the corresponding silicide layer 261 at a certain point, all the AA pillars 132 in the same column can be electrically coupled together and to the first lead-out structure 271, even if some AA pillars are displaced to a large extent that projections thereof on a surface of the substrate do not overlap at all with a projection of the first lead-out structure 271 on the surface of the substrate. As shown in FIGS. 10A-10C, similar to the silicide layers 261, the plurality of first lead-out structures 271 are arranged along the first direction and are parallel to each other, and each extends along the second direction.

As shown in FIGS. 10A-10C, the first lead-out structures 271 penetrate through the second insulation layer 270 to contact and electrically couple to the corresponding silicide layers 261. The first lead-out structures 271 can be formed by various suitable methods. In some embodiments, a plurality of trenches for the first lead-out structures 271 can be formed in the second insulation layer 270 by photolithography and etching to expose at least portions of the silicide layers 261, and then a conductive material can be filled therein to form the first lead-out structures 271.

The second lead-out structures 272 penetrate through the second insulation layer 270 and the semiconductor material layer 130, and are electrically coupled to corresponding third conductive structures 253. Since the second lead-out structures 272 penetrate through the semiconductor material layer 130, they are also referred to as "through silicon contacts (TSCs)."

The second lead-out structures 272 can be formed by various suitable methods. In some embodiments, a plurality of holes can be formed in the second insulation layer 270 and the semiconductor material layer 130 by photolithography and etching, to expose the third conductive structures 253, then an insulation layer can be formed on a sidewall of each hole, followed by deposition of a conductive material into the holes to form the second lead-out structures 272.

The third lead-out structures 273 penetrate through the second insulation layer 270 and a portion of the semiconductor material layer 130, and are electrically coupled to corresponding gate electrode layers 240. The third lead-out structures 273 can be, e.g., word line pick-ups. The third lead-out structures 273 are illustratively shown in FIG. 10C using dashed lines, while in reality they may not be seeable from the cross-sectional view in FIG. 10C. The third lead-out structures 273 can be formed using, e.g., a method similar to that for forming the second lead-out structures 272, except that the holes for the third lead-out structures 273 do not need to penetrate through the entire semiconductor material layer 130.

Each of the first lead-out structures 271, the second lead-out structures 272, and the third lead-out structures 273 can be made of a conductive material, such as polysilicon or metal, and the metal can include copper, aluminum, tungsten, or a combination thereof. The conductive materials for the first lead-out structures 271, the second lead-out structures 272, and the third lead-out structures 273 can be same or different. For example, the first lead-out structures 271, the second lead-out structures 272, and the third lead-out structures 273 can be made of tungsten. In some embodiments, after the trenches for the first lead-out structures 271 and the holes for the second lead-out structures 272 and the third lead-out structures 273 can be formed, the conductive material can be deposited to form the first, second, and third lead-out structures 271, 272, and 273 at once, and planarization process can be performed to remove excessive conductive material on the second insulation layer 270 so that the first, second, and third lead-out structures 271, 272, and 273 are separated from each other.

Other processes for forming the final memory device, such as wiring and packaging, can be further performed, descriptions of which are omitted here.

The present disclosure also provides a memory device. FIG. 10A is a top view of a portion of a memory device 1000 consistent with the present disclosure. FIG. 10B is a cross-sectional view along A-A' line in FIG. 10A, and FIG. 10C is a cross-sectional view along C-C' line in FIG. 10A. As shown in FIGS. 10A-10C, the memory device 1000 includes the second substrate 410, the first insulation layer 260, the first conductive structures 251, the second conductive structures 252, the semiconductor material layer 130, the first spacers 211, the second spacers 311, the gate dielectric layers 230, the gate electrode layers 240, the silicide layers 261, the second insulation layer 270, the first lead-out structures 271, the second lead-out structures 272, and the third lead-out structures 273.

The second insulation layer 260 is located over the second substrate 410, the semiconductor material layer 130 is located over the second insulation layer 260, and the second insulation layer 270 is located over the semiconductor material layer 130.

The first spacers 211 are buried in the semiconductor material layer 130, and can be made of an insulation material such as silicon oxide, silicon nitride, or silicon oxynitride, or can be a composite layer including two or more dielectric films made of same, similar, or different materials. The second spacers 311 are also buried in the semiconductor material layer 130, and can be made of an insulation material such as silicon oxide, silicon nitride, or silicon oxynitride, or can be a composite layer including two or more dielectric films made of same, similar, or different materials. The first spacers 211 and the second spacers 311 can be made of a same material or be made of different materials.

The first spacers 211 can be arranged in a row along the first direction (e.g., x-direction in FIG. 10A). Each of the first spacers 211 can extend along the second direction (e.g., y-direction in FIG. 10A), and the first spacers 211 can be parallel to each other.

The second spacers 311 can be arranged in a row along the second direction. Each of the second spacers 311 can extend along the first direction, and the second spacers 311 can be parallel to each other.

As shown in FIG. 10A, the first spacers 211 intersect the second spacers 311, and together define a plurality of areas in the semiconductor material layer 130. That is, at least a portion of the semiconductor material layer 130 is divided by the first spacers 211 and the second spacers 311 into the plurality of AA pillars 132, each of which serves as an active area (AA) for a vertical-channel transistor of the memory device 1000. In the example shown in FIGS. 10A-10C, each of the AA pillars 132 has a rectangular shape. In some other embodiments, the AA pillars 132 can have a different shape, such as a square shape. As described above, the region of the semiconductor material layer 130 constituted by the active areas can also be referred to as an "active region," i.e., the active region of the semiconductor material layer 130 can include a plurality of active areas (AA pillars 132).

Further, as shown in, e.g., FIG. 10C, since the top surface of the second spacer 311 is lower than the top surface of the semiconductor material layer 130, a portion of the semiconductor material layer 130 on the second spacers 311 form the plurality semiconductor material strips 134 parallel to each other in the first direction, and each extending in the second direction and connecting a corresponding column of AA pillars 132 at the bottoms of the AA pillars 132.

A gate dielectric layer 230 is located at a sidewall of each of the AA pillars 132, and a gate electrode layer 240 is formed on the gate dielectric layer 230. The gate dielectric layers 230 can include a dielectric material, such as silicon oxide, silicon nitride, or silicon oxynitride, or can be a composite layer including two or more dielectric films made of same, similar, or different materials. The gate electrode layer 240 can be made of a conductive material, such as polysilicon or metal, where the metal can include, e.g., copper, aluminum, tungsten, or a combination thereof. The gate dielectric layer 230 and the gate electrode layer 240 together form a gate structure of a vertical-channel transistor in the memory device 1000. In the example shown in FIG. 10C, the gate structure is located on one sidewall of the AA pillar 132. In some other embodiments, the gate structure can be located on more sidewalls of the AA pillar 132, such as two opposite sidewalls in the second direction.

The plurality of active areas (AA pillars 132) can be arranged in an array expanding along the first direction and the second direction. That is, the plurality of active areas (AA pillars 132) can be considered as including one or more columns of active areas (AA pillars 132) arranged along the first direction and each extending in the second direction; or the plurality of active areas (AA pillars 132) can be considered as including one or more rows of active areas arranged along the second direction and each extending in the first direction. One gate dielectric layer 230 and one corresponding gate electrode layer 240 can be located on a side wall of one corresponding active area (AA pillar 132). The gate electrode layers 240 of each row of active areas (AA pillars 132) can be connected, for example, via portions of the gate electrode layer formed on the sidewalls of the first spacer pillars as described above, to form a word line of the memory device 1000.

A first conductive structure 251 (AA pick up for the vertical-channel transistor) is located on the bottom surface of each of the plurality of active areas (AA pillars 132) of the semiconductor material layer 130, and a second conductive structure 252 is formed at the bottom surfaces of each column of first conductive structures 251 to electrically couple the first conductive structures 251. The third conductive structures 253 are also formed on the bottom surface of a region of the semiconductor material layer 130 outside the active region, and each of the third conductive structures 253 can be electrically coupled to a column of first conductive structures 251 via a corresponding second conductive structure 252. The second conductive structures 252 are arranged along the first direction and each second conductive structure 252 extends along the second direction. The second conductive structures 252 can be approximately parallel to each other. Each of the plurality of active areas (AA pillars 132) can be electrically coupled to a corresponding one of the first conductive structures 251. One column of first conductive structures 251 corresponding to one column of active areas AA can be electrically coupled to a corresponding second conductive structure 252. A first insulation layer 260 is formed on the top surface of the semiconductor material layer 130. The first conductive structures 251, the second conductive structures 252, and the third conductive structures 253 can be embedded in the first insulation layer 260.

The first insulation layer 260 can be made of a dielectric material, such as silicon oxide, silicon nitride, or silicon oxynitride, or can be a composite layer including two or more dielectric films made of same, similar, or different materials.

The second substrate 410 can be made of, e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a composite material such as silicon-on-insulator (SOI) or germanium-on-insulator (GOI), or a combination of any of the above materials.

The silicide layers 261 are embedded in the semiconductor material layer 130. Each silicide layer 261 is located on a semiconductor material stripe 134 connecting a corresponding column of AA pillars 132. The silicide layers 261 can be parallel to each other and arranged in a row along the first direction. As described above, each silicide layer 261 can be formed by silicide a portion of a corresponding semiconductor material stripe 134. In some other embodiments, a semiconductor material stripe 134 can be completely silicided to form a silicide layer 261, i.e., the silicide layer 261 can completely replace the semiconductor material stripe 134 in the final memory device 1000, and be in contact with a corresponding column of second spacers 311.

The first lead-out structures 271, the second lead-out structures 272, and the third lead-out structures 273 are buried at least partially in, e.g., the second insulation layer 270. These lead-out structures serve to electrically coupling embedded structures to other parts of the memory device 1000.

The first lead-out structures 271 are located at positions on the top surfaces of the silicide layers 261 corresponding to the plurality of AA pillars 132. The first lead-out structures 271 can be, e.g., bit line pick-ups. The shape of a first lead-out structure 271 can be a strip shape, similar to that of a silicide layer 261. Because a silicide layer 261 connects and electrically couples a column of AA pillars 132, as long as the first lead-out structure 271 can contact the corresponding silicide layer 261 at a certain point, all the AA pillars 132 in the same column can be electrically coupled together and to the first lead-out structure 271, even if some AA pillars are displaced to a large extent that projections thereof on a surface of the substrate do not overlap at all with a projection of the first lead-out structure 271 on the surface of the substrate. As shown in FIGS. 10A-10C, similar to the silicide layers 261, the plurality of first lead-out structures 271 are arranged along the first direction and are parallel to each other, and each extends along the second direction. The first lead-out structures 271 penetrate through the second insulation layer 270 to contact and electrically couple to the corresponding silicide layers 261.

The second lead-out structures 272 penetrate through the second insulation layer 270 and the semiconductor material layer 130, and are electrically coupled to corresponding third conductive structures 253. Since the second lead-out structures 272 penetrate through the semiconductor material layer 130, they are also referred to as "through silicon contacts (TSCs)." Each second lead-out structure 272 can be surrounded by an insulation layer and be electrically isolated from the semiconductor material layer 130 by the insulation layer.

The third lead-out structures 273 penetrate through the second insulation layer 270 and a portion of the semiconductor material layer 130, and are electrically coupled to corresponding gate electrode layers 240. The third lead-out structures 273 can be, e.g., word line pick-ups. The third lead-out structures 273 are illustratively shown in FIG. 10C using dashed lines, while in reality they may not be seeable from the cross-sectional view in FIG. 10C.

Each of the first lead-out structures 271, the second lead-out structures 272, and the third lead-out structures 273 can be made of a conductive material, such as polysilicon or metal, and the metal can include copper, aluminum, tungsten, or a combination thereof. The conductive materials for the first lead-out structures 271, the second lead-out structures 272, and the third lead-out structures 273 can be same or different.

Figures 11, 12:
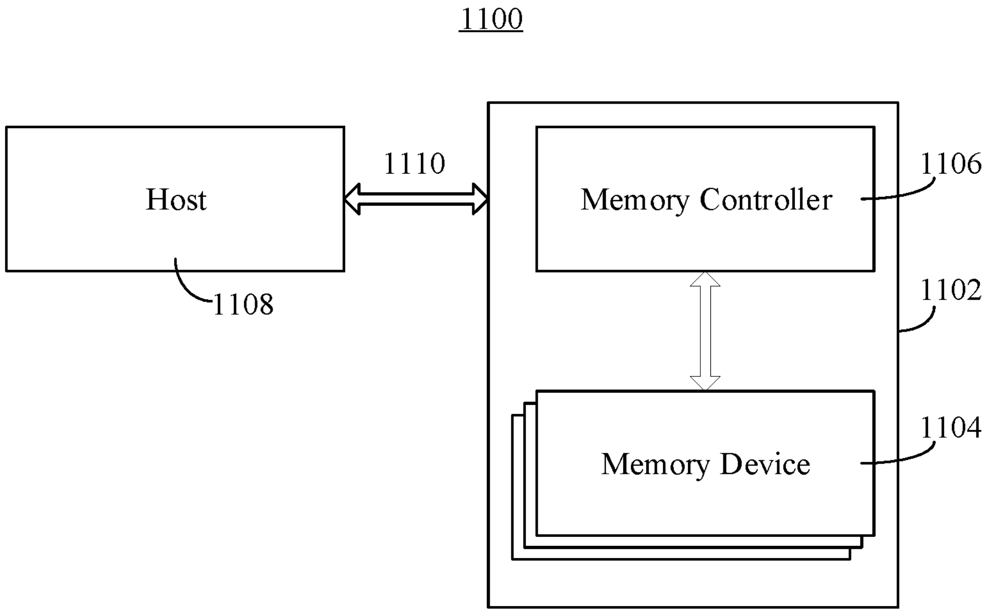
FIG. 11 is a block diagram of an example system consistent with the disclosure.
FIG. 12 is a block diagram of an example memory card consistent with the disclosure.

FIG. 11 is a block diagram of an example system 1100 having a memory device consistent with the disclosure. The system 1100 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 11, the system 1100 includes a memory system 1102 having one or more memory devices 1104 and a memory controller 1106. The system 1100 further includes a host 1108. The host 1108 can be a processor of an electronic device, such as a central processing unit (CPU), or a system-on-chip (SoC), such as an application processor (AP). The host 1108 can be configured to send or receive data to or from the one or more memory devices 1104. Each of the one or more memory devices 1104 can include a memory device consistent with the disclosure, such as one of the example memory devices described above.

The memory controller 1106 is coupled to the one or more memory devices 1104 and the host 1108, and is configured to control operation of the one or more memory devices 1104, according to some implementations. The memory controller 1106 can also be integrated into the one or more memory devices 1104. The memory controller 1106 can manage the data stored in the one or more memory devices 1104 and communicate with the host 1108 via an interface 1110. In some embodiments, the memory controller 1106 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 1106 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 1106 can be configured to control operations of the one or more memory devices 1104, such as read, erase, and program operations.

Figure 13:
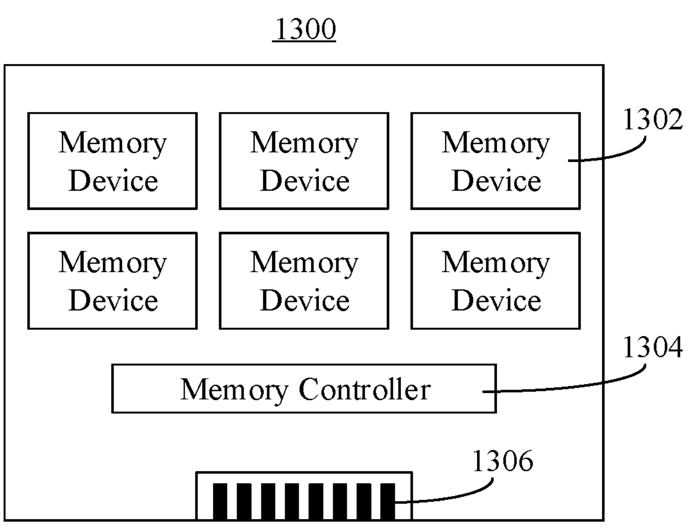
FIG. 13 is a block diagram of an example solid-state drive consistent with the disclosure.

The memory controller 1106 and the one or more memory devices 1104 can be integrated into various types of storage devices, for example, be included in the same package, such as a universal Flash storage (UFS) package or an eMMC package. That is, the memory system 1102 can be implemented and packaged into different types of end electronic products. FIGS. 12 and 13 are block diagrams of an example memory card 1200 and an example SSD 1300, respectively, consistent with the disclosure. As shown in FIG. 12, a single memory device 1202 and a memory controller 804 are integrated into the memory card 1200. The memory device 1202 can include a memory device consistent with the disclosure, such as one of the above-described example memory devices. The memory card 1200 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 12, the memory card 1200 further includes a memory card interface or interface connector 1206 configured to couple the memory card 1200 to a host (e.g., the host 1108 shown in FIG. 11).

As shown in FIG. 13, multiple memory devices 1302 and a memory controller 1304 are integrated into the SSD 1300. Each of the memory devices 1302 can include a memory device consistent with the disclosure, such as one of the above-described example memory devices. As shown in FIG. 13, the SSD 1300 further includes an SSD interface or interface connector 1306 configured to couple the SSD 1300 to a host (e.g., the host 1108 shown in FIG. 11).

Although the principles and implementations of the present disclosure are described by using specific embodiments in the specification, the foregoing descriptions of the embodiments are only intended to help understand the idea of the present disclosure. A person of ordinary skill in the art can make modifications to the specific implementations and application range according to the idea of the present disclosure. For example, one or more components of the disclosed memory device can be omitted or one or more components not explicitly described above can be added to the memory device. Similarly, one or more steps in the fabrication process of the memory device can be omitted or one or more steps not explicitly described above can be included in the fabrication process. The content of the specification should not be construed as a limitation to the present disclosure.

What is claimed is:

1. A method of forming a memory device comprising:

providing a base wafer, the base wafer including a semiconductor material layer;

forming a plurality of first spacers in the semiconductor material layer, the plurality of first spacers extending from a first surface of the semiconductor material layer to a second surface of the semiconductor material layer;

forming a plurality of second spacers in the semiconductor material layer, the plurality of second spacers crossing the plurality of first spacers and extending from the first surface of the semiconductor material layer to a position inside the semiconductor material layer, providing a plurality of semiconductor material strips each being between bottoms of the second spacers and the second surface of the semiconductor material layer; and performing a silicidation process at the second surface of the semiconductor material layer to convert at least portion of each of the semiconductor material strips into a silicide layer, wherein the silicide layer extends from the second surface of the semiconductor material layer into the semiconductor material layer and is sandwiched between two neighboring ones of the plurality of first spacers at the second surface.

2. A memory device comprising:

a semiconductor material layer;

a plurality of first spacers in the semiconductor material layer, the plurality of first spacers extending from a first surface of the semiconductor material layer to a second surface of the semiconductor material layer;

a plurality of second spacers in the semiconductor material layer, the plurality of second spacers crossing the plurality of first spacers and extending from the first surface of the semiconductor material layer to a position inside the semiconductor material layer; and a plurality of silicide layers extending from the second surface of the semiconductor material layer into the semiconductor material layer, each of the plurality of silicide layers having a strip shape and being sandwiched between two neighboring ones of the plurality of first spacers at the second surface.

3. The memory device of claim 2, further comprising:

a plurality of semiconductor material strips each being sandwiched between two neighboring ones of the first spacers along a direction perpendicular to an extending direction of the plurality of first spacers between the first and second surfaces, and being between the second spacers and a corresponding one of the plurality of silicide layers along the extending direction of the plurality of first spacers.

4. The memory device of claim 2, further comprising:

a plurality of active area (AA) pillars including a portion of the semiconductor material layer sandwiched between two neighboring ones of the plurality of first spacers and further between two neighboring ones of the plurality of second spacers, wherein the plurality of silicide layers are aligned with the plurality of active area (AA) pillars.

5. The memory device of claim 2, further comprising:

a plurality of gate structures each being buried in a corresponding one of the plurality of second spacers and being on sidewalls of a corresponding column of a plurality of active area (AA) pillars, each of the plurality of AA pillars including a portion of the semiconductor material layer sandwiched between two neighboring ones of the plurality of first spacers and between two neighboring ones of the plurality of second spacers;

wherein each of the plurality of gate structures includes:

a gate dielectric layer on the sidewalls of the corresponding column of the plurality of AA pillars; and a gate electrode layer on the gate dielectric layer.

6. The memory device of claim 2, further comprising:

an insulation layer over the second surface of the semiconductor material layer; and a plurality of lead-out structures in the insulation layer, each of the plurality of lead-out structures being in contact with a corresponding one of the plurality of silicide layers.

7. The memory device of claim 6, wherein each of the plurality of lead-out structures has a strip shape.

8. A memory system comprising:

a memory device including:

a semiconductor material layer;

a plurality of first spacers in the semiconductor material layer, the plurality of first spacers extending from a first surface of the semiconductor material layer to a second surface of the semiconductor material layer;

a plurality of second spacers crossing the plurality of first spacers and extending from the first surface of the semiconductor material layer to a position inside the semiconductor material layer; and a plurality of silicide layers extending from the second surface of the semiconductor material layer into the semiconductor material layer, the plurality of silicide layers each being sandwiched between two neighboring ones of the plurality of first spacers at the second surface; and a memory controller coupled to the memory device and configured to control operation of the memory device.

9. The system of claim 8, further comprising:

a plurality of semiconductor material strips each being sandwiched between two neighboring ones of the first spacers along a direction perpendicular to an extending direction of the plurality of first spacers between the first and second surfaces, and being between the second spacers and a corresponding one of the plurality of silicide layers along the extending direction of the plurality of first spacers.

10. The system of claim 8, further comprising:

a plurality of active area (AA) pillars including a portion of the semiconductor material layer sandwiched between two neighboring ones of the plurality of first spacers and further between two neighboring ones of the plurality of second spacers, wherein the plurality of silicide layers are aligned with the plurality of active area (AA) pillars.

11. The system of claim 8, wherein:

each of the plurality of silicide layers is converted from a portion of a corresponding semiconductor material strip that is away from bottoms of the second spacers.

12. The system of claim 8, wherein:

the plurality of first spacers are arranged in a row along a first direction and extend along a second direction; and the plurality of second spacers are arranged in a row along the second direction and extend along the first direction.

13. The system of claim 8, further comprising:

a plurality of gate structures each being buried in a corresponding one of the plurality of second spacers and being on sidewalls of a corresponding column of a plurality of active area (AA) pillars, each of the plurality of AA pillars including a portion of the semiconductor material layer sandwiched between two neighboring ones of the plurality of first spacers and between two neighboring ones of the plurality of second spacers;

wherein each of the plurality of gate structures includes:

a gate dielectric layer on the sidewalls of the corresponding column of the plurality of AA pillars; and a gate electrode layer on the gate dielectric layer.

14. The system of claim 13, wherein:

an insulation layer is disposed over a first surface of the semiconductor material layer;

a plurality of first conductive structures are formed in the insulation layer, each of the plurality of first conductive structures having a pillar shape and contacting a corresponding one of the plurality of active area (AA) pillars.

15. The system of claim 14, wherein:

a plurality of second conductive structures are formed in the insulation layer, each of the plurality of second conductive structures having a strip shape and contacting a corresponding column of the plurality of first conductive structures.

16. The system of claim 8, further comprising:

an insulation layer over the second surface of the semiconductor material layer; and a plurality of lead-out structures in the insulation layer, each of the plurality of lead-out structures being in contact with a corresponding one of the plurality of silicide layers.

17. The system of claim 16, wherein each of the plurality of lead-out structures has a strip shape.

18. The memory device of claim 2, wherein:

each of the plurality of silicide layers is converted from a portion of a corresponding semiconductor material strip that is away from bottoms of the second spacers.

19. The memory device of claim 2, wherein:

the plurality of first spacers are arranged in a row along a first direction and extend along a second direction; and the plurality of second spacers are arranged in a row along the second direction and extend along the first direction.

20. The memory device of claim 5, wherein:

an insulation layer is disposed over a first surface of the semiconductor material layer;

a plurality of first conductive structures are formed in the insulation layer, each of the plurality of first conductive structures having a pillar shape and contacting a corresponding one of the plurality of active area (AA) pillars; and a plurality of second conductive structures are formed in the insulation layer, each of the plurality of second conductive structures having a strip shape and contacting a corresponding column of the plurality of first conductive structures.

* * * * *